United States Patent
Horn et al.

(10) Patent No.: US 10,018,803 B2
(45) Date of Patent: Jul. 10, 2018

(54) DEVICE AND METHOD FOR CONTROLLING POSITIONING OF MULTIPLE ADJUSTABLE MIRROR ELEMENTS IN A MULTI-MIRROR ARRANGEMENT

(71) Applicant: Carl Zeiss SMT GmbH, Oberkochen (DE)

(72) Inventors: Jan Horn, Munich (DE); Markus Holz, Aalen (DE); Joerg Specht, Koenigsbronn (DE); Johannes Eisenmenger, Ulm (DE); Stefan Krone, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/332,187

(22) Filed: Oct. 24, 2016

(65) Prior Publication Data
US 2017/0038555 A1    Feb. 9, 2017

Related U.S. Application Data

(63) Continuation of application No. PCT/EP2015/058516, filed on Apr. 20, 2015.

(30) Foreign Application Priority Data

Apr. 25, 2014  (DE) .................. 10 2014 207 866

(51) Int. Cl.
*G03B 27/54*     (2006.01)
*G03B 27/42*     (2006.01)
(Continued)

(52) U.S. Cl.
CPC ......... *G02B 7/1827* (2013.01); *G02B 17/008* (2013.01); *G02B 26/0841* (2013.01);
(Continued)

(58) Field of Classification Search
CPC .............. G02B 26/0841; G02B 7/1827; G02B 17/008; G03F 7/7085; G03F 7/70075; G03F 7/70116; G03F 7/702
See application file for complete search history.

(56) References Cited

U.S. PATENT DOCUMENTS

2008/0013680 A1    1/2008  Singer et al.
2010/0039629 A1*   2/2010  Xalter ............... G02B 26/0833
                                                                    355/67
(Continued)

FOREIGN PATENT DOCUMENTS

DE    10 2010 061 790 A1    5/2012
DE    10 2011 006 100 A1    9/2012
(Continued)

OTHER PUBLICATIONS

German Examination Report, with translation thereof, for corresponding DE Appl No. 10 2014 207 866.0, dated Mar. 11, 2015.
(Continued)

*Primary Examiner* — Mesfin Asfaw
(74) *Attorney, Agent, or Firm* — Fish & Richardson P.C.

(57) ABSTRACT

An external facility is used to control positioning of multiple displaceable mirror elements of a multi-mirror arrangement. The external facility is to a multi-mirror arrangement via a data channel having a bandwidth of at least 1 kHz per controlled degree of freedom of displacement.

20 Claims, 14 Drawing Sheets

(51) Int. Cl.
 *G02B 7/182* (2006.01)
 *G02B 26/08* (2006.01)
 *G03F 7/20* (2006.01)
 *G02B 17/00* (2006.01)

(52) U.S. Cl.
 CPC .......... *G03F 7/702* (2013.01); *G03F 7/70075* (2013.01); *G03F 7/7085* (2013.01); *G03F 7/70116* (2013.01)

(56) References Cited

U.S. PATENT DOCUMENTS

| | | |
|---|---|---|
| 2013/0293161 A1 | 11/2013 | Al Dibs et al. |
| 2014/0055767 A1 | 2/2014 | Waldis et al. |
| 2014/0327896 A1 | 11/2014 | Waldis et al. |
| 2015/0185469 A1 | 7/2015 | Horn et al. |

FOREIGN PATENT DOCUMENTS

| | | |
|---|---|---|
| DE | 10 2012 201 509 A1 | 8/2013 |
| DE | 10 2012 218 219 A1 | 4/2014 |
| EP | 1 225 481 A2 | 7/2002 |
| EP | 2 687 906 A2 | 1/2014 |
| WO | WO 2008/095695 A2 | 8/2008 |
| WO | WO 2010/049076 A2 | 5/2010 |
| WO | WO 2013/120926 A1 | 8/2013 |

OTHER PUBLICATIONS

International Search Report for corresponding PCT Appl No. PCT/EP2015/058516, dated Jun. 3, 2015.

* cited by examiner

DEVICE AND METHOD FOR CONTROLLING POSITIONING OF MULTIPLE ADJUSTABLE MIRROR ELEMENTS IN A MULTI-MIRROR ARRANGEMENT

CROSS-REFERENCE TO RELATED APPLICATIONS

The present application is a continuation of, and claims benefit under 35 USC 120 to, international application PCT/EP2015/058516, filed Apr. 20, 2015, which claims benefit under 35 USC 119 of German patent application DE 10 2014 207 866.0, filed Apr. 25, 2014. The entire disclosure of international application PCT/EP2015/058516 and German Application No. 10 2014 207 866.0 are incorporated by reference herein.

FIELD

The disclosure relates to a device and a method for controlling the positioning of multiple adjustable mirror elements in a multi-mirror arrangement. The disclosure additionally relates to an optical component including such a device and a multi-mirror arrangement. Finally, the disclosure relates to an illumination optical unit and an illumination system for a projection exposure apparatus including at least one such component, and a projection exposure apparatus including a corresponding illumination optical unit. Finally, the disclosure relates to a method for producing a microstructured or nanostructured component, and such a component.

BACKGROUND

The positioning of the individual mirrors of a multi-mirror arrangement is very complex.

A multi-mirror arrangement having adjustable mirror elements with a device for displacing same is known for example from WO 2013/120926 A1.

SUMMARY

The disclosure seeks to provide an improved device for controlling the positioning of multiple adjustable mirror elements in a multi-mirror arrangement. The disclosure provides a device including a control facility, which is embodied separately from the multi-mirror arrangement and is connected to the multi-mirror arrangement in a data-transmitting manner via at least one first data channel having a bandwidth of at least 1 kHz. The data channel has, in particular, a bandwidth which enables a control bandwidth of at least 1 kHz.

Hereinafter, the bandwidth of a data channel should be understood to mean the upper limiting frequency thereof. The bandwidth represents, in particular, the maximum frequency of a signal which can be transmitted via the data channel. A data channel having a given bandwidth is suitable for transmitting signals for a control, in particular a closed-loop control, with this bandwidth.

Furthermore, hereinafter, control bandwidth should be understood to mean the frequency range of the frequencies, in particular the resonant frequencies, to be controlled, in particular to be compensated for.

A further property of a data channel is the maximum data rate thereof. The relationship between the bandwidth of a closed-loop control and the data rate of the corresponding data channel used therefor arises by way of the sampling rate of the signal transmitted via the channel. The sampling rate indicates how many measurement and/or controller actuating values are calculated per unit time and are transported via a given data channel.

The sampling rate is desirably at least double the magnitude of the bandwidth. It may be demanded that the sampling rate be at least five times, in particular at least ten times, the magnitude of the control bandwidth. The maximum required data rate of a data channel arises in particular as a product of the required sampling rate and the bit depth of the signal to be transmitted.

Given a predefined bit depth of the signal, the maximum data rate of a data channel is thus associated directly with the bandwidth thereof.

The high bandwidth enables a very fast control of the positioning of the mirror elements. The bandwidth of the data channel, which is also designated as fast data channel, can be in particular at least 2 kHz, in particular at least 3 kHz, in particular at least 5 kHz, in particular at least 10 kHz.

The mirror elements generally have at least one degree of freedom of displacement, in particular at least two, in particular at least three, degrees of freedom of displacement. This involves degrees of freedom of tilting, in particular. The individual mirrors are tiltable in particular about at least one, in particular at least two linearly independent axes. The individual mirrors can also be linearly displaceable, in particular in the direction of their surface normals. Hereinafter, reference is made exclusively to the tilting of the individual mirrors, for the sake of simplicity. However, this should not be understood to be restrictive.

The first data channel has a bandwidth as described above in particular for each degree of freedom of displacement of each of the individual mirror elements.

The high bandwidth makes it possible, via the device, to damp undesired movements, in particular oscillations, in particular in the range of the natural frequencies, in particular in the range of 100 Hz to 5000 Hz, of the mirror elements. One aspect of the disclosure therefore relates to the use of the device for damping the mirror elements.

With the aid of the device, a control of the positioning of the mirror elements of a multi-mirror arrangement is possible, wherein the number of mirror elements is at least 100, in particular at least 10 000, in particular at least 30 000, in particular at least 100 000, in particular at least 300 000, in particular at least 1 000 000.

A data channel should be understood to mean, in particular, a structural component for transmitting a signal from the control facility to the multi-mirror arrangement. Such a data channel can be formed, in particular, by a suitable cable. In principle, a wireless data transmission is also possible. Generally, a data channel denotes a mechanism for enabling a flow of information. As a simplification, the term data channel is also used to denote the flow of information itself.

The first data channel has per sample in particular a bit depth of a maximum of 32 bits, in particular a maximum of 16 bits, in particular a maximum of 8 bits, in particular a maximum of 4 bits, in particular a maximum of 2 bits. The total data flow can be reduced by the small bit depth. The complexity of the data transmission is reduced as a result. Moreover, in particular, the total volume of the data to be transmitted is reduced as a result.

The device includes, in particular, multiple first data channels. The multiple data channels can be formed, in particular, by a single or a plurality of structural components. At least one first data channel is provided, in particular, for each of the mirror elements. In each case at least one first data channel can also be provided, in particular, for each degree of freedom of displacement of each of the mirror elements. The number of data channels is in particular at least of the same magnitude as the number of mirror elements, in particular at least double the magnitude of the number of mirror elements. The number of data channels is in particular at least 1000, in particular at least 10 000, in particular at least 30 000, in particular at least 50 000, in particular 100 000, in particular at least 300 000, in particular at least 500 000.

In accordance with a further aspect of the disclosure, the device includes a supervisory unit, in which a common output signal is determined from the signals of at least two data channels.

It is also possible for a plurality of such supervisory units to be provided.

The supervisory unit can be, in particular, a digital component. It is connected on the output side to the DAC of the multi-mirror arrangement.

Via the supervisory unit, in particular the signals of the first and second data channels of a mirror element or of a degree of freedom of displacement thereof can be combined to form a common signal.

Via the supervisory unit, the signals of the data channels can be coded and/or compressed. Details of the coding and/or compression are described in even greater detail below.

In accordance with one aspect of the disclosure, the data channel is connected to a digital-to-analog converter (DAC) in a signal-transmitting manner. The DAC can be, in particular, part of an application specific integrated circuit (ASIC). The ASIC in turn can be part of the multi-mirror arrangement (Multi Mirror Array, MMA). For details, reference should be made to WO 2013/120926 A1.

The data channel can be, in particular, part of a digital control loop.

In accordance with a further aspect of the disclosure, the device includes at least one second data channel for signal transmission to the multi-mirror arrangement which has a bandwidth of at most 500 Hz, in particular at most 200 Hz, in particular at most 50 Hz, in particular at most 10 Hz, in particular at most 1 Hz. In this case, the bandwidth is once again in a direct relationship with the sampling frequency. The second data channel is also designated as slow data channel. The at least one second data channel has in particular a bit depth of at least 10 bits, in particular at least 16 bits, in particular at least 32 bits, in particular at least 64 bits, in particular at least 128 bits, in particular at least 256 bits, in particular at least 512 bits, in particular at least 1024 bits. A second data channel can be provided in particular for each of the mirror elements, in particular each degree of freedom of displacement of each of the mirror elements.

The bandwidths of the first and second data channels of a given mirror element or the degrees of freedom of displacement thereof have in each case a ratio of at least 2:1, in particular at least 3:1, in particular at least 5:1, in particular at least 10:1, in particular at least 30:1, in particular at least 50:1, in particular at least 100:1. The corresponding bit depths have in each case a ratio of at most 1:2, in particular at most 1:3, in particular at most 1:5, in particular at most 1:10, in particular at most 1:30, in particular at most 1:50, in particular at most 1:100.

In accordance with a further aspect of the disclosure, the device includes at least one sensor facility, in particular at least one external sensor facility. The sensor facility makes it possible, in particular, to detect the displacement positions of the mirror elements of the multi-mirror arrangement relative to a reference point outside the multi-mirror arrangement. It makes it possible, in particular, to detect the displacement positions relative to the housing of the projection exposure apparatus. In accordance with one aspect of the disclosure, the device can exclusively include such external sensors. It can include in particular a multiplicity of such sensors. By detecting the displacement positions relative to an external reference point, the control of the displacement positions of the mirror elements and thus the optical performance of the multi-mirror arrangement are significantly improved. It additionally enables novel functions. With the control of the mirrors of the multi-mirror arrangement via an external control facility, new optical functions are conceivable, in particular, in which the parameters of the exact imaging of a lithography mask, in particular of an EUV lithography mask, onto a wafer can be optimized by targeted but flexible influencing of the EUV radiation with the aid of the actuating angles of the mirrors of the multi-mirror arrangement.

In accordance with a further aspect of the disclosure, the device includes at least one sensor facility having a bandwidth of at least 1 kHz. The bandwidth, in particular the sampling frequency of the sensor facility, can be per controlled axis in particular at least 2 kHz, in particular at least 3 kHz, in particular at least 5 kHz, in particular at least 10 kHz. The sensor facility can be, in particular, part of a control loop designated as fast control loop.

The device includes, in particular, a multiplicity of such sensor facilities. It can have in particular at least 10, in particular at least 20, in particular at least 30, in particular at least 50 sensor facilities. In particular in each case a camera, in particular having a CMOS chip, can serve as the sensor facility.

The sensor facility can have a bit depth of at most 1024 bits, in particular at most 512 bits, in particular at most 256 bits, in particular at most 128 bits, in particular at most 64 bits. It can also have a greater bit depth.

In each case the displacement position of one or more of the mirror elements or the time derivative thereof can be detected via the sensor facility.

As in the case of the data channels which connect the control facility to the multi-mirror arrangement, the sensor facility can also include faster sensors and slower, but more precise sensors. For the bandwidths and bit depths of the faster and slower sensor facilities, reference should be made to those of the first and second data channels.

The sensor system, that is to say the totality of the sensor facilities, enables both a very precise detection of the displacement positions of the individual mirror elements and/or the time derivative thereof and a very fast detection of these variables. The speed of the sensor facility is rated here by the bandwidth, i.e. the sampling frequency of the fast sensors. In this case, the precision is limited by the bit depth, in particular of the slower sensors.

The disclosure seeks to provide an improved an optical component. The disclosure provides an optical component including a multi-mirror arrangement and a device according to the description above.

The positioning of the mirror elements is improved via the device described above. The further advantages are evident from those already described for the device.

The multi-mirror arrangement is, in particular, a microelectromechanical system (MEMS). For general details thereof, reference should again be made to WO 2013/120926 A1. This may involve, in particular, a multi-mirror arrangement for reflecting EUV radiation, in particular radiation in a wavelength range of 5 nm to 30 nm, in particular of less than 14 nm.

The number of mirror elements in the multi-mirror arrangement is in particular at least 1000, in particular at least 10 000, in particular at least 30 000, in particular at least 50 000, in particular at least 100 000, in particular at least 200 000, in particular at least 300 000, in particular at least 1 000 000.

In accordance with one aspect of the disclosure, the multi-mirror arrangement includes mechanical mechanism for damping excitations of the mirror elements in the region of at least one of their resonant frequencies. The multi-mirror arrangement includes, in particular, mechanical mechanism for damping excitations having frequencies above 100 Hz, in particular above 200 Hz, in particular above 400 Hz, in particular above 800 Hz.

Such a damping can be achieved, in particular, with the aid of a suitable suspension and/or mounting of the mirror elements.

In accordance with a further aspect of the disclosure, analog circuits are provided for actuating the mirror elements, the analog circuits being embodied without feedback. The circuits are embodied, in particular, as application specific integrated circuits (ASICs).

The optical component can in particular exclusively include digital control loops. In particular, the embodiment of the ASICs is simplified as a result. As a result, overall the optical component becomes simpler, in particular simpler to produce and simpler to test. Further advantages are presented below with reference to the exemplary embodiments.

The disclosure seeks to provide an improved a method for controlling the positioning of multiple mirror elements in a multi-mirror arrangement. The disclosure provides a method that includes the following steps:

providing a multi-mirror arrangement having multiple mirror elements displaceable via actuators, providing a control facility for generating signals for actuating the actuators for displacing the mirror elements, generating a data stream with signals for activating the actuators via the control facility, transmitting the data stream via at least one first data channel (63) to the multi-mirror arrangement The heart of the disclosure is that the at least one first data channel has a bandwidth which is at least double the magnitude of a resonant frequency of one of the mirror elements. The bandwidth, in particular the sampling frequency, of the first data channel is, in particular, at least double the magnitude of the smallest resonant frequency of the mirror elements. For further details, reference should be made to the above description of the device for controlling the positioning of the mirror elements, in particular to the features and properties of the first data channel.

The advantages of the method are evident from those described above.

The control facility is, in particular, an external control facility, that is to say that it is not part of the multi-mirror arrangement, in particular not integrated into the latter, but rather is embodied separately from the multi-mirror arrangement.

The control facility is embodied digitally, in particular. It has, in particular, multiple data channels. The signals from at least two data channels can be combined to form a common output signal. For further details, reference should be made to the description above and also to the description of the exemplary embodiments.

In accordance with a further aspect of the disclosure, each data channel has a maximum data flow of at most 50 kbit/s per regulated axis. The maximum data flow per regulated axis of each data channel is in particular at most 30 kbit/s, in particular at most 20 kbit/s, in particular at most 10 kbit/s, in particular at most 7 kbit/s.

In particular, the total volume of data to be transmitted per unit time to the multi-mirror arrangement by the control facility is limited as a result.

In accordance with a further aspect of the disclosure, the positioning of the mirror elements and/or changes therein are detected via at least one sensor facility, in particular via at least one external sensor facility. In this case, an external sensor facility should be understood to mean, in particular, that the displacement positions of the mirror elements and/or the changes thereof are measured relative to a reference point outside the multi-mirror arrangement in particular relative to a reference point on a frame or a housing or some other positionally fixed part of the projection exposure apparatus. The sensor facility is embodied in particular separately from the multi-mirror arrangement. The multi-mirror arrangement can also include integrated sensors, in particular on the ASICs.

The external sensor facility is connected to the control facility in a data-transmitting manner. The external sensor facility is, in particular, part of at least one digital control loop.

As already described above, it is also possible for a plurality of sensor facilities to be provided, which may be in particular parts of separate control loops, in particular control loops having different sampling frequencies.

In accordance with a further aspect of the disclosure, the data channel has a channel structure having at least two communication channels. The data channel has, in particular, a logical subdivision into at least two communication channels, in particular into multiple communication channels. The number of communication channels can be, in particular, precisely equal to the number of mirror elements in the multi-mirror arrangement or the number of mirror elements multiplied by the number of their degrees of freedom.

Moreover, it is possible to combine the at least one first, fast data channel and the at least one second, slower data channel to form a single data channel. It is possible, in particular, to transmit a plurality of communication channels, that is to say the information flow from the control facility to the mirror elements, in common data channels, in a bundled fashion. In particular, a multiplexing method is provided for logically subdividing the data channels. Advantageous examples of the separation of the individual communication channels are, in particular, a time slot implemented separation, a frequency slot implemented separation, a code multiplexing method, in particular a so-called code division multiple axis (CDMA) method, or a space multiplexing method (known as: Space Division Multiple Access, SPMA).

The terms multiplexing and multiple access are used interchangeably hereinafter, even if the data channels are connected on the input and output sides in each case to one or more transmitters and receivers.

In accordance with a further aspect of the disclosure, the data stream generated by the control facility is coded. The coding can in particular also involve a compression of the data stream. Provision may be made, in particular, for individually coding or compressing the signals for each of the mirror elements and/or each degree of freedom thereof.

The coding can in particular involve one or more of the following variants: Limitation of the dynamic range, in particular of the bit depth, differential transmission, transmission of the slope of the signal waveform (Slew Rate), nonlinear quantization, vector quantization, in particular in a tilting plane, vector coding, limitation of the frequency ranges, limitation of the information transport to signal contents regarding different basis functions than in Fourier decomposition or coding according to an entropy method. For details of the different coding variants, reference should be made to the description of the exemplary embodiments.

In accordance with a further aspect of the disclosure, provision is made for coding and/or compressing the signals for a plurality of mirror elements or the degrees of freedom thereof in a bundled fashion. In particular, correlations between the individual mirror elements or the degrees of freedom thereof are taken into account in this case. The volume of data to be communicated per unit time can be considerably reduced as a result.

In accordance with a further aspect of the disclosure, provision is made for coding and/or compressing the signals for a plurality of mirror elements or the degrees of freedom thereof in a model-based fashion. That is to say that a prediction for a sample is generated in the control unit in a model-based fashion. The control unit knows the current position measurement value by way of the sensor facility and can therefore calculate the prediction error of the model and transmit the prediction error via a data channel to the multi-mirror arrangement. The decoding facility or decompression facility on the multi-mirror arrangement uses the same model for the controlled system, for example micromirrors, and can reconstruct the current sensor value using the prediction error and a model prognosis. The reduction of the data rate between control facility and multi-mirror arrangement is achieved by transmitting the prediction error at a high sampling rate only with a few bits, that is to say with a small bit depth.

In accordance with one particular advantageous variant, past values are also taken into account in the coding and/or compression. The coding/compression is extended in particular to the temporal dimension. This is also referred to as "3D coding".

In the bundled coding it may be advantageous, in particular, to re-sort the channels. The data reduction can be further improved as a result. The re-sorting can be performed, in particular, in such a way that correlations are increased, in particular maximized. It can be carried out in particular for maximizing the compression efficiency. A possibility by way of example is a clustering, that is to say a combination, of the signals with respect to mirrors having similar tilting angle setpoint values, tilting angle absolute values or tilting angle directions.

Furthermore, prior knowledge and/or ambient conditions can be taken into account in the coding. In particular, further measurement signals can be taken into account in this case. Further ambient conditions or further prior knowledge that can be used in the coding concern a selection from the following list: tilting angle setpoint values, temperature, temperature profile, EUV excitation, EUV source trigger, wafer stage movements, measurement data of dose sensors and measurement data of global acceleration sensors.

Further features of the disclosure are to improve an illumination optical unit and an illumination system for a projection exposure apparatus, and a projection exposure apparatus for microlithography.

Features are achieved via an optical component according to the description above. The advantages are evident from those already described.

Further features of the disclosure are to improve a method for producing a microstructured or nanostructured component, and a component produced according to the method.

Features are achieved by providing a corresponding projection exposure apparatus. For the advantages, reference should again be made to the description above.

BRIEF DESCRIPTION OF THE DRAWINGS

Further features, details and advantages of the disclosure will become apparent from the description of exemplary embodiments with reference to the drawings, in which.

DETAILED DESCRIPTION

First of all, the basic design of a projection exposure apparatus 1 is described below on the basis of the figures.

Figure 1:
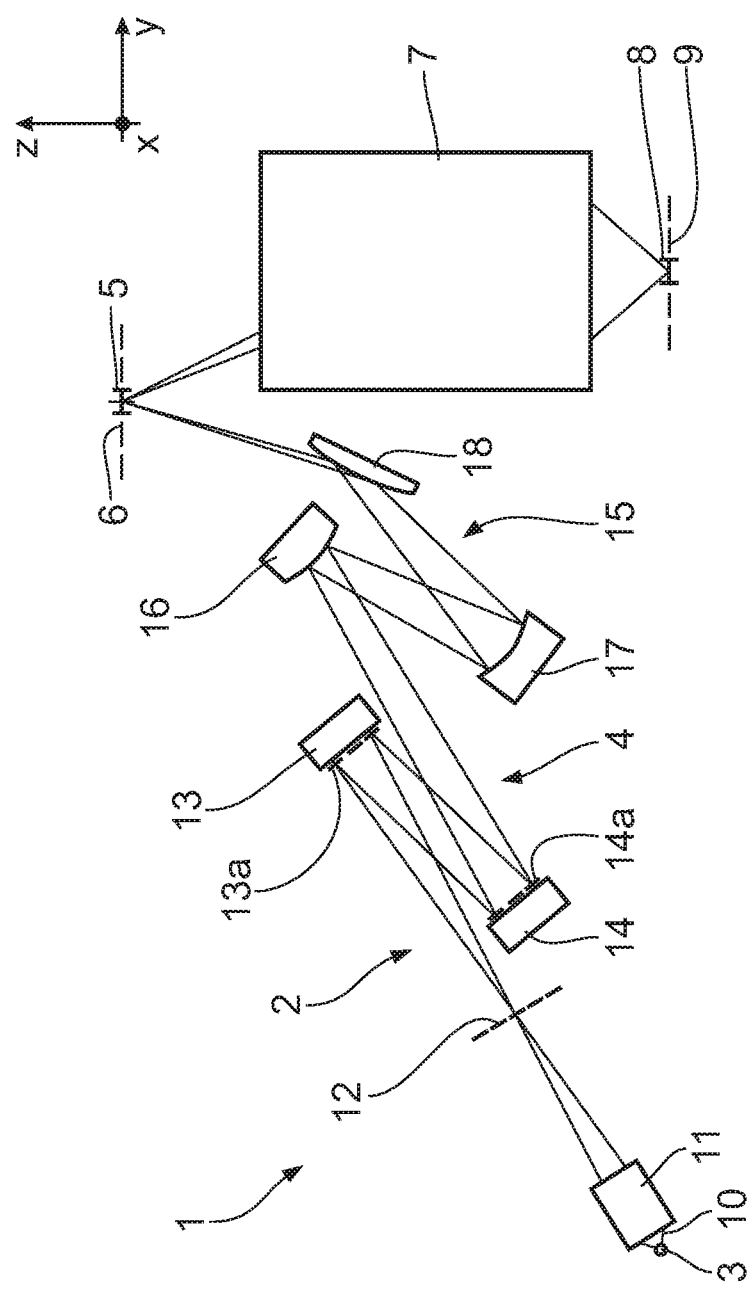
FIG. 1 shows a schematic illustration of a projection exposure apparatus for microlithography, with an illumination system and a projection optical unit in meridional section.

FIG. 1 schematically shows a projection exposure apparatus 1 for microlithography in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, the reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing and is arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13 with a multiplicity of field facets 13*a*. The field facet mirror 13 is arranged in a plane of the illumination optical unit 4 which is optically conjugate with respect to the object plane 6.

The EUV radiation 10 is also referred to hereinafter as used radiation, illumination light or as imaging light.

Downstream of the field facet mirror 13, the EUV radiation 10 is reflected by a pupil facet mirror 14 with a multiplicity of pupil facets 14*a*. The pupil facet mirror 14 lies either in the entrance pupil plane of the illumination optical unit 7 or in an optically conjugate plane with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets 13*a* which illuminate the entire object field 5 by themselves is represented by exactly one of the individual mirrors. Alternatively, it is possible to construct at least some or all of the field facets 13*a* using a plurality of such individual mirrors. The same correspondingly applies to the configuration of the pupil facets 14*a* of the pupil facet mirror 14, which are respectively assigned to the field facets 13*a* and which can be formed in each case by a single individual mirror or by a plurality of such individual mirrors.

The EUV radiation 10 is incident on the two facet mirrors 13, 14 at an angle of incidence that is less than or equal to 25°, measured in relation to the normal of the mirror surface. The EUV radiation 10 therefore impinges on the two facet mirrors 13, 14 in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a mirror for grazing incidence ("grazing incidence mirror"). The transfer optical unit 15 together with the pupil facet mirror 14 is also referred to as a sequential optical unit for transferring the EUV radiation 10 from the field facet mirror 13 towards the object field 5. The illumination light 10 is guided from the radiation source 3 towards the object field 5 via a plurality of illumination channels. Each of these illumination channels is assigned a field facet 13*a* of the field facet mirror 13 and a pupil facet 14*a* of the pupil facet mirror 14, the pupil facet being disposed downstream of the field facet. The individual mirrors of the field facet mirror 13 and of the pupil facet mirror 14 can be tiltable by an actuator system, such that a change in the assignment of the pupil facets 14*a* to the field facets 13*a* and correspondingly a changed configuration of the illumination channels can be achieved. Different illumination settings result, which differ in the distribution of the illumination angles of the illumination light 10 over the object field 5.

In order to facilitate the explanation of positional relationships, use is made below of, inter alia, a global Cartesian xyz-coordinate system. The x-axis runs perpendicular to the plane of the drawing towards the observer in FIG. 1. The y-axis runs towards the right in FIG. 1. The z-axis runs upwards in FIG. 1.

The field facet mirror 13 is embodied in the form of a multi-mirror or micromirror array (MMA). The multi-mirror or micro-mirror array (MMA) is also referred to merely as a mirror array or multi-mirror arrangement 22 in the following text. The field facet mirror 13 is embodied as a microelectromechanical system (MEMS). It has a multiplicity of individual mirrors arranged in a matrix-like manner in rows and columns in an array. In the following text, the individual mirrors are also referred to as mirror elements 23. The mirror elements 23 are designed to be tiltable by an actuator system, as will be explained below. Overall, the field facet mirror 13 has approximately 100 000 of the mirror elements 23. Depending on the size of the mirror elements 23, the field facet mirror 13 can also have for example 1000, 5000, 7000 or else hundreds of thousands of mirror elements 23, in particular more than 200 000, in particular more than 300 000, in particular more than 500 000.

A spectral filter can be arranged upstream of the field facet mirror 13 and separates the used radiation 10 from other wavelength components of the emission of the radiation source 3 that are not usable for the projection exposure. The spectral filter is not illustrated.

The field facet mirror 13 is impinged on by used radiation 10 having a power of 840 W and a power density of 6.5 kW/m2. The used radiation 10 can also have a different power and/or power density.

The mirror elements 23 are arranged in a substrate 30. The latter is mechanically connected to a mirror body 32 by way of a thermal conduction portion 31. An articulation body 33 which permits a tilt of the mirror body 32 relative to the substrate 30 is part of the thermal conduction portion 31. The articulation body 33 can be embodied as a flexure which permits a tilt of the mirror body 32 about defined tilt degrees of freedom, for example about one or two tilt axes, which, in particular, are arranged perpendicular to one another. The articulation body 33 has an outer holding ring 34, which is fastened to the substrate 30. Furthermore, the articulation body 33 has an inner holding body 35 connected to the outer holding ring 34 in an articulated manner. The holding body is arranged centrally under a reflection surface 36 of the mirror element 23. A spacer 37 is arranged between the central holding body 35 and the reflection surface 36.

An actuator pin 38 is arranged on the holding body 35 on the side thereof opposite to the spacer 37. The actuator pin 38 can have a smaller external diameter than the spacer 37. The actuator pin 38 can also have the same diameter as, or a greater diameter than, the spacer 37.

Figure 2:
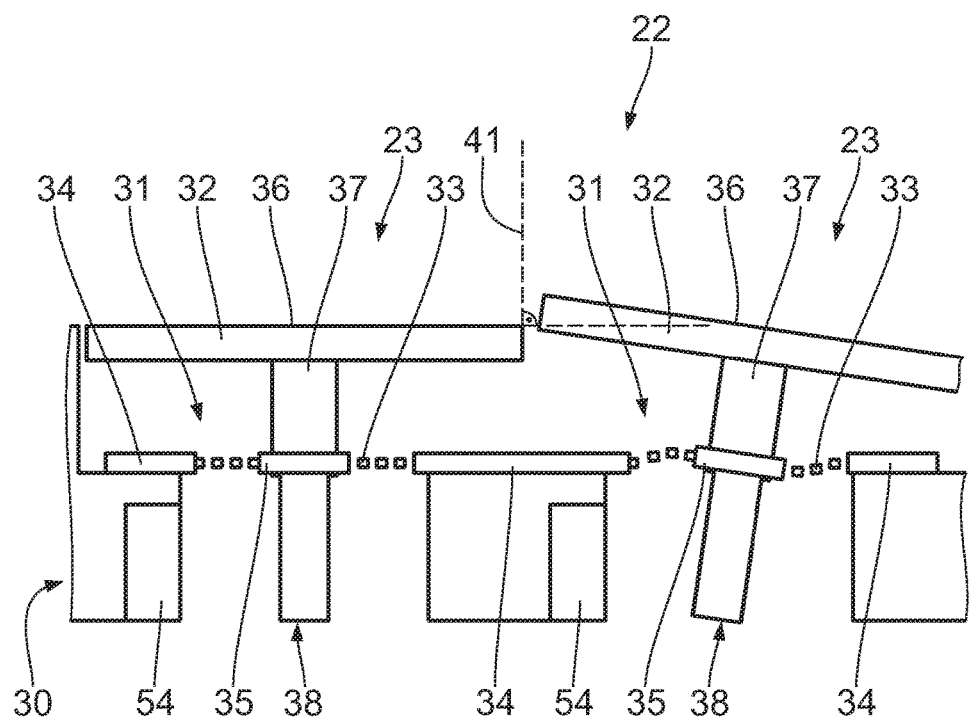
FIG. 2 shows a schematic illustration of two juxtaposed mirror elements of a multi-mirror arrangement of the projection exposure apparatus in accordance with FIG. 1, FIGS. 3 and 4 show further schematic cross sections through embodiments of optical components including a multi-mirror arrangement.

The substrate 30 forms a sleeve surrounding the actuator pin 38. Integrated into the sleeve are a total of three electrodes 54 in each case, the electrodes being arranged electrically insulated from one another and in each case extending over approximately just under 120° in the circumferential direction. The electrodes 54 constitute counter-electrodes to the actuator pin 38 embodied as an electrode pin in this embodiment. Here, in particular, the actuator pin 38 can be embodied as a hollow cylinder. In principle, it is also possible to provide a different number of electrodes 54 per actuator pin 38. In particular, four or more electrodes 54 can be provided per actuator pin 38. By generating a potential difference between one or more of the electrodes 54 and the actuator pin 38, it is possible to generate an electrostatic force on the actuator pin 38, which force, as depicted in an exemplary manner in the right half of FIG. 2, may lead to deflection of the mirror element 23.

Reference is made to WO 2010/049 076 A2 in respect of further details, in particular about the arrangement of the individual mirrors 23 in the substrate 30 and the pivotability thereof via the actuators, as well as the embodiment of the articulation bodies and thermal conduction portions 31.

The mirror array 22 with the mirror elements 23 and the substrate 30 has an overall area extending perpendicular to a surface normal 41. It includes a multiplicity of the mirror elements 23, which each have a reflection surface 36 and two degrees of freedom of displacement. In general, the mirror elements 23 have at least one degree of freedom of displacement. They can also have three or more degrees of freedom of displacement. They have in particular at least one, preferably at least two degrees of freedom of tilting. They can also have a degree of freedom of translation. The reflection surface 36 can have an extent of 0.5 mm×0.5 mm, 1 mm×1 mm, 4 mm×4 mm, 8 mm×8 mm or 10 mm×10 mm. It can also deviate from the square shape. Further dimensions of the reflection surface 36 are likewise possible.

The reflection surface 36 of the mirror elements 23 has a planar embodiment. In principle, it can also have a concave or convex embodiment or an embodiment as a free-form surface.

The reflection surface 36 of the mirror elements 23 is provided, in particular, with a (multilayer) coating for optimizing the reflectivity thereof at the wavelength of the used radiation 10. In particular, a multilayer coating enables the reflection of used radiation 10 with a wavelength in the EUV range, in particular in the range from 5 nm to 30 nm.

The mirror elements 23 are held by the substrate 30. The substrate 30 has an edge region 42 extending in the direction perpendicular to the surface normal 41. In particular, the edge region 42 is arranged in a manner encircling the mirror elements 23. In the direction perpendicular to the surface normal 41, it has a width b, in particular a maximum width b, of at most 5 mm, in particular at most 3 mm, in particular at most 1 mm, in particular at most 0.5 mm, in particular at most 0.3 mm, in particular at most 0.2 mm. Therefore, the overall area of the mirror array 22 projects by at most 5 mm, in particular at most 3 mm, in particular at most 1 mm, in particular at most 0.5 mm, in particular at most 0.3 mm, in particular at most 0.2 mm over the overall reflection surface, i.e. over the outer edge thereof, in the direction perpendicular to the surface normal 41.

In addition to the mirror array 22, the optical component 40 includes a carrying structure 43. The carrying structure 43 is arranged offset from, in particular adjacent to, the mirror array 22 in the direction of the surface normal 41. It preferably has a cross section which is identical to that of the substrate 30 of the mirror array 22. In general, it projects by at most 5 mm, in particular at most 3 mm, in particular at most 1 mm, in particular at most 0.5 mm, in particular at most 0.1 mm, in particular at most 0.05 mm, in particular not at all, over the substrate 30 and hence over the overall area of the mirror array 22 in the direction perpendicular to the surface normal 41. Such an arrangement is also referred to as an arrangement according to the "shadow casting principle". This is understood to mean, in particular, that the carrying structure 43 is arranged completely within a parallel projection of the overall area of the mirror array 22 in the direction of the surface normal 41.

The carrying structure 43 is made of a ceramics-containing and/or silicon-containing and/or aluminum-containing material. This enables the dissipation of heat from the mirror array 22 with, at the same time, high mechanical stability. Examples for the material of the carrying structure 43 are ceramic materials, silicon, silicon dioxide, aluminum nitrite and aluminum oxide, for example $Al_2O_3$ ceramic material. In particular, the carrying structure 43 can be produced from a wafer. The carrying structure 43 can also be produced from quartz or a glass wafer, which is provided with so-called thermal vias.

The carrying structure 43 has a cutout 44 open on one side. The cutout 44 forms a receiving space, open on one side, for receiving further functional constituents. On the side thereof opposite to the mirror array 22, the cutout 44 is delimited by a base 45 of the carrying structure in the direction of the surface normal 41. Laterally, i.e. in the direction perpendicular to the surface normal 41, it is delimited by an edge region 46 of the carrying structure 43. In a direction perpendicular to the surface normal 41, the edge region 46 has a width $b_C$. In this case, it holds true that $0.5 \times b \leq b_C \leq 2 \times b$. In particular, the edge region 46 of the carrying structure 43 can be just as wide as the edge region 42 of the substrate 30, $b=b_C$.

The carrying structure 43 is mechanically connected to the mirror array 22 only in this edge region 46. A sealing element 40 is arranged between the carrying structure 43 and the mirror array 22. The sealing element 40 is integrated into a metallization on the rear side 48 of the substrate 30 of the mirror array 22. It can also be embodied as a sealing ring arranged on the edge region 46 of the carrying structure 43. The receiving space formed by the cutout 44 is therefore encapsulated, i.e. sealed in a liquid-tight, in particular gas-tight manner, at least during the production of the component 40. In principle, it is possible to arrange the ASICs 52 in an encapsulated manner, i.e. sealed in a liquid-tight, in particular gas-tight manner. To this end, a continuous intermediate layer (not depicted in the figures) between the mirror array 22 and the ASICs 52 still is involved.

A multiplicity of signal lines 47 are integrated into the carrying structure 43. The signal lines 47 are embodied as electrical vertical interconnect accesses, so-called "vias". They are bonded directly at the rear side 48 of the mirror array 22 opposite to the reflection surfaces 36. They are moreover provided with contact elements 50 on the side opposite to the mirror array 22, i.e. on the rear side 49 of the carrying structure 43. Each component 40 can have more than 30, in particular more than 50, in particular more than 70 signal lines 47. These signal lines 47 serve, inter alia, to supply power to an integrated control facility 51 for controlling the displacement of the mirror elements 23. The control facility 51 for controlling the displacement of the mirror elements 23 is integrated into the carrying structure 43. In particular, it is embodied as an application-specific integrated circuit 52 (ASIC). The component 40 can have a plurality of ASICs 52. It includes at least one ASIC 52, in particular at least two, in particular at least four, in particular at least nine, in particular at least 16, in particular at least 25, in particular at least 100 ASICs 52. Here, each one of the ASICs 52 is signal-connected to at least one mirror element 23, in particular to a plurality of mirror elements 23, in particular to at least two, in particular at least four, in particular at least eight mirror elements 23. In respect of details about controlling the actuators for displacing the mirror elements 23, reference is made to WO 2010/049 076 A2.

On the rear side 49 of the carrying structure 43, the component 40 has an electrical interface 55. In particular, the interface 55 is completely arranged on the rear side 49 of the carrying structure 43 lying opposite the mirror array 22. Lateral contacts, which are possible in principle, can be completely dispensed with. Therefore, the "shadow casting principle" is also observed in the signal flow. Consequently, both the component parts of the component 40 and also the signal and heat flow in the latter are oriented in the direction of the surface normal 41. Therefore, the component 40 has a vertical integration.

Figure 3:
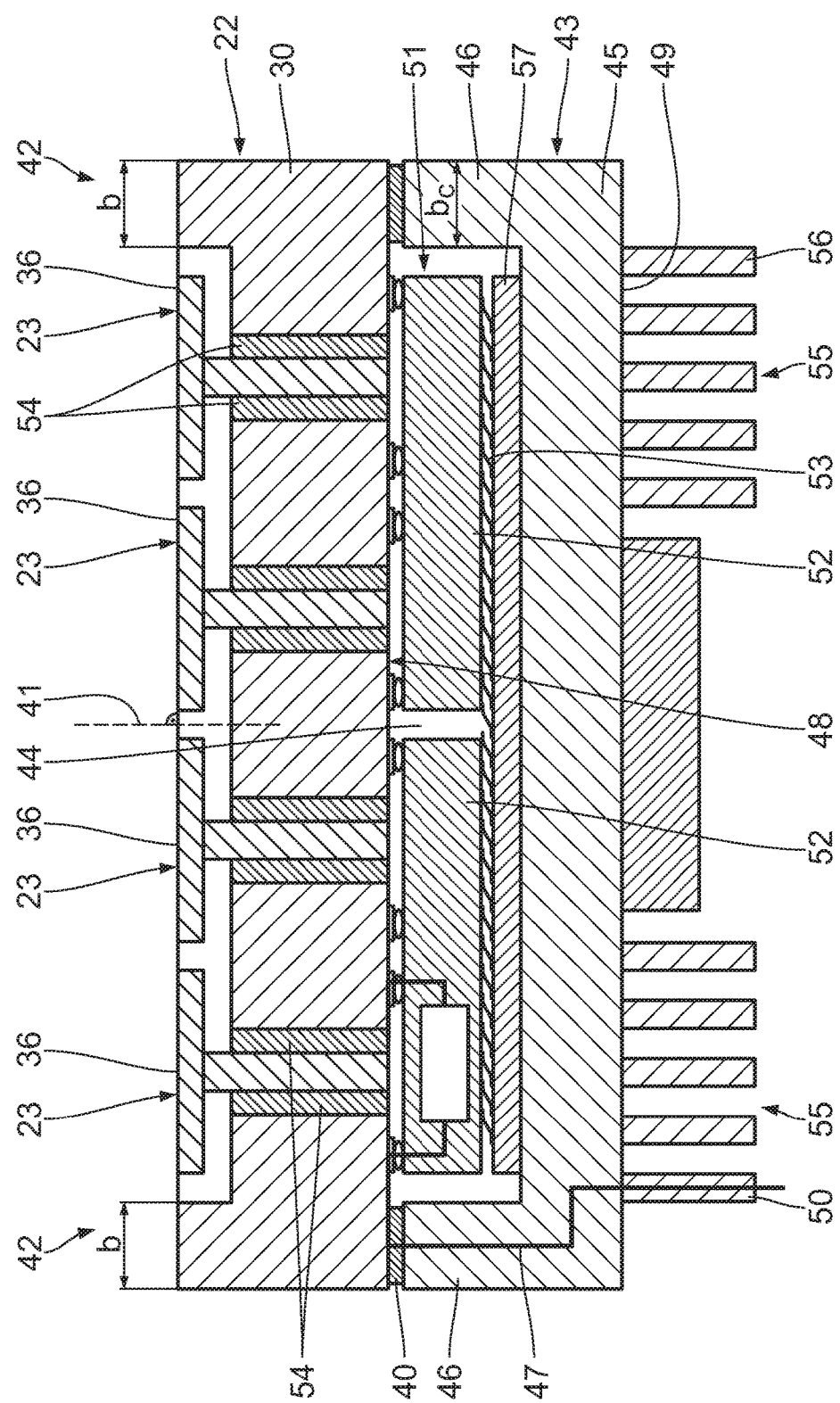
Figure 4:
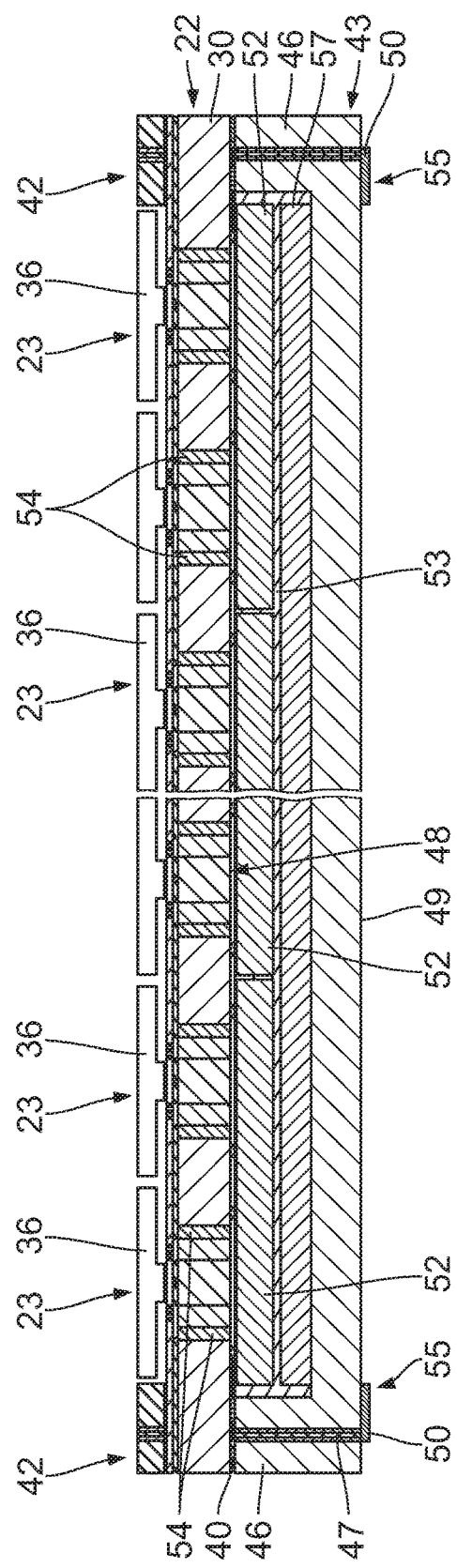

In the case of the embodiment illustrated in FIG. 3, the electrical interface 55 has a multiplicity of contact pins 56 applied to the rear side 49 of the carrying structure 43. As an alternative thereto, the contact elements 50 of the electrical interface 55 can also be embodied in a planar fashion or as integrated pins in the carrying structure 43. In this case, vertical interconnect accesses (vias) in the carrying structure 43, which are embodied e.g. as through-bores filled with gold, are partly exposed in the region of the rear side 49 of the carrying structure 43. In particular, this can be achieved by etching away part of the material of the carrying structure 43 surrounding the vias. The exposed piece of the vias now forms the contact element 50.

Furthermore, the carrying structure 43 includes a ferromagnetic element 57.

An additional heat-conducting element 53 can be arranged between the ASICs 52 and the base 45 of the carrying structure 43, in particular between the ASICs 52 and the ferromagnetic element 57. A plurality of heat-conducting elements 53 can also be provided.

When using the projection exposure apparatus 1 with one of the collector variants described above, the reticle and the wafer, which carries a coating which is light-sensitive to the illumination light 10, are provided. Subsequently, at least one portion of the reticle is projected onto the wafer with the aid of the projection exposure apparatus 1. When projecting the reticle onto the wafer, the reticle holder and/or the wafer holder can be displaced in the direction parallel to the object plane 6 or parallel to the image plane 9. The displacement of the reticle and of the wafer can preferably be carried out in a manner synchronous to one another. Finally, the light-sensitive layer on the wafer that has been exposed with the illumination light 10 is developed. A microstructured or nanostructured component, in particular a semiconductor chip, is produced in this way.

The above description of the projection exposure apparatus 1 and the constituents thereof should be understood to be by way of example. Alternative embodiments are possible. For further details of the projection exposure apparatus 1, in particular of the multi-mirror arrangement 22, reference should be made, in particular, to DE 10 2011 006 100 A1 and WO 2013/120 926 A1.

A device 61 and a method for controlling the positioning of the mirror elements 23 of the mirror array 22 are described below.

In the case of the control of the positioning of the mirror elements 23 of the mirror array 22, a distinction is usually drawn between a local control, which for example is embodied as an analog control loop on the ASICs 52 and is also referred to as inner control loop, and an external or outer control loop 62.

The outer control loop 62 can be embodied in particular separately from the multi-mirror arrangement 22, in particular separately from the ASIC 52. In particular, it is not closed locally in the multi-mirror arrangement 22.

In this case, the local control loop serves primarily for damping oscillations of the mirror elements 23, while the actual positioning, that is to say the setting of the displacement positions of the mirror elements 23, is performed via the outer control loop 62. The outer control loop 62 usually operates with a relatively small bandwidth and a low sampling frequency.

The control device 61 includes the outer control loop 62. It is connected to the mirror array 22 in a data-transmitting manner via a data channel 63. The data channel 63 has a bandwidth of at least 1 kHz. The bandwidth of the data channel 63 can be in particular at least 2 kHz, in particular at least 3 kHz, in particular at least 5 kHz, in particular at least 10 kHz.

The control device 61 enables, in particular, a control of the positioning of the mirror elements 23 over the entire bandwidth thereof. The control device 61 enables, in particular, both the damping of oscillations of the mirror elements 23, in particular in the region of the resonant frequencies thereof, and the predefinition and control of the displacement positions thereof. With regard to the frequency spectrum of the mirror elements, reference should be made for example to FIG. 41 of WO 2013/120 926 A1 and the associated description.

The control device 61 includes a control facility 64. The control facility 64 can be arranged outside the illumination optical unit 4. The control facility 64 includes a first control unit 65 and a second control unit 66.

The first control unit 65 is also designated as fast control unit. The second control unit 66 is also designated as slow control unit.

The first control unit 65 has a bandwidth of at least 1 kHz, in particular at least 2 kHz, in particular at least 3 kHz, in particular at least 3 kHz, in particular at least 5 kHz, in particular at least 10 kHz. It has a bit depth of at most 32 bits, in particular at most 16 bits, in particular at most 8 bits, in particular at most 4 bits, in particular at most 2 bits.

The second control unit 66 has a bandwidth of at most 500 Hz, in particular at most 300 Hz, in particular at most 200 Hz, in particular at most 100 Hz, in particular at most 50 Hz. The second control unit 66 has a bit depth of at least 8 bits, in particular at least 16 bits, in particular at least 32 bits, in particular at least 64 bits, in particular at most 1024 bits, in particular at most 512 bits, in particular at most 256 bits, in particular at most 128 bits.

In other words, the first control unit 65 has a large bandwidth. However, it has a relatively small bit depth. The second control unit 66 has a large bit depth. It has a relatively small bandwidth. The total data flow of the two control units 65, 66 can be limited as a result. The data flow of the control units 65, 66 is, per regulated axis, in particular a maximum of in each case 50 kbit/s, in particular at most 30 kbit/s, in particular at most 20 kbit/s, in particular at most 10 kbit/s, in particular at most 7 kbit/s.

The control units 65, 66 are connected to a protocol generating unit 67 in each case in a data-transmitting manner. The protocol generating unit 67 serves for generating a control data stream 68. The control data stream 68 can have in particular a logical subdivision. This will be explained in even more detail below.

The protocol generating unit 67 is connected to an electronic component 69. The electronic component 69 can form an intermediate control unit which is integrated into the EUV illumination system 2.

Furthermore, the control device 61 includes a supervisory unit 70. The electronic component 69 is connected to the supervisory unit 70 via two data connections 71, 72. The two data connections 71, 72 can also be combined structurally. The data connection 71 serves for transmitting the high-frequency, that is to say fast, data stream with a small bit depth. The data connection 72 serves for transmitting the slower, that is to say low-frequency, data stream with a larger bit depth.

Via the supervisory unit 70, a single common output signal is generated from the data streams transmitted by the data connections 71, 72. The output signal is transmitted to a digital-to-analog converter 73 (DAC) via the data channel 63. The digital-to-analog converter 73 can be arranged on the ASIC 52. It can be embodied in particular as a constituent of the ASIC 52.

The control signal is transmitted to a driver circuit 74 by the digital-to-analog converter 73. Via the driver circuit 74, the actuators of the mirror elements 23 are activated, that is to say that the positioning of the mirror elements 23 is controlled by open-loop or closed-loop control.

To summarize, the entire data transmission between the control facility 64 and the mirror array 22, in particular the ASIC 52, is designated as data transmission channel or data transmission system or else in shortened form as data channel.

The control device 61 additionally includes a monitoring system 75. It includes, in particular, an electronic monitoring system 75. The monitoring system 75 is embodied digitally, in particular. Preferably, the entire control device 61 is embodied digitally. The monitoring system 75 can for example include one or more cameras, in particular digital cameras 76, or be connected thereto in a data-transmitting manner. It can include in particular a multiplicity of cameras 76 having a multiplicity of CMOS sensors. The number of cameras 76, in particular the number of CMOS sensors, can be in the range of 1 to 50, in particular in the range of 10 to 50. The cameras 76, in particular the CMOS sensors, can be separate from the control device 61. They can also form a constituent of the control device 61.

The cameras 76 can form in particular a constituent of the monitoring system 75. Generally, the cameras 76 and the monitoring system 75 are part of an external sensor 79. The monitoring system 75 has a high bandwidth. The bandwidth of the monitoring system 75 is in particular at least half the magnitude, in particular at least of the same magnitude, in particular of exactly the same magnitude as the largest bandwidth of the control units 65, 66.

The monitoring system 75 is connected to the control facility 64, in particular to the control units 65, 66, in a data-transmitting manner.

The displacement positions, in particular the tilting angles of the mirror elements 23, and/or the changes thereof are thus not detected via a MEMS-internal sensor system, but rather via the external sensor system 79.

The external sensor system 79 is used to detect the displacement positions of the mirror elements 23 and/or the changes thereof, in particular the time derivatives thereof, relative to an external reference point, that is to say a reference point outside the mirror array 22. The external sensor system 79 detects, in particular, the displacement positions and/or the changes thereof relative to an external fixed point, for example the housing of the projection exposure apparatus 1. This also makes it possible to detect a movement of the entire mirror array 22 in which the mirror elements 23 and the associated ASICs 52 move in an identical way with one another and thus remain positionally fixed relative to one another.

With regard to the monitoring system 75, reference should be made to WO 2008/095695 A2.

In principle, the control device 61 can be designed in such a way that it damps all oscillations and/or excitations of the mirror elements 23 that are to be expected during operation of the projection exposure apparatus 1, at least up to a predetermined degree. In particular the mechanical design of the mirror array 22, in particular the structural details of the suspensions of the mirror elements 23, can be significantly simplified as a result. However, it is also possible to reduce, in particular to suppress, at least some of the mechanical oscillations and/or excitations that are to be expected via a suitable design of the mirror elements, in particular the mountings thereof. The mirror elements 23 can have, in particular, mountings which effectively damp, in particular suppress, oscillations above a limiting frequency, in particular above the lowest resonant frequency of the respective mirror element 23, in particular above 500 Hz, in particular above 1 kHz. The damping to be achieved via the device 61 can be simplified as a result. In particular the maximum required force or the maximum required torque for controlling the mirror elements 23 can be reduced by a suitable mechanical suspension, in particular by a suitable mechanical damping. This has the effect that the data flow to be transmitted from the control device 61 to the mirror array 22 can be reduced.

The control of the positioning of the mirror elements 23 with the aid of the outer control loop 62 has the following advantages, inter alia:

The construction of the mirror array 22 becomes simpler. It can be tested more simply, in particular. This is advantageous particularly in the case of a modular construction of the mirror array 22.

The assembly of the mirror array 22 becomes simpler and faster. In particular also the costs for the production of the facet mirror and of the illumination optical unit 4 and of the projection exposure apparatus 1 overall are reduced as a result.

Overall, the costs of the mirror array 22 are reduced by the simpler construction thereof.

Instabilities, in particular during a test method and/or qualification method, are avoided as a result of avoiding a closed control loop in the mirror array 22. The switch-on process is facilitated, in particular speeded up, as a result.

Avoiding a control loop on the ASIC 52 improves the electromagnetic compatibility (EMC) and/or the noise behavior. The ASIC 52 becomes in particular more robust, in particular with respect to electromagnetic interference.

The power supply for the mirror array 22 becomes simpler. This, too, reduces the construction and/or the costs of the mirror array 22. Sensor elements on the ASIC 52 can be dispensed with. This has the effect that terminals without ESD projection can be dispensed with on the ASIC 52. This has the following background: In the case of ASIC terminals for linking capacitive sensors, ESD (Electrostatic Discharge) protective facilities often have to be dispensed with since the parasitic effects as a result of the ESD protective circuit often reduce the quality of the measurement signals to an excessively great extent.

The possibilities for the architecture of the mirror array 22 and the arrangement thereof are increased with an outer control loop 62. Overall, the flexibility is increased. In particular, the ASICs 52 need no longer be arranged in direct proximity to the mirror arrays 22. They can be in particular at a distance of more than 1 mm, in particular more than 10 mm, from the mirror array 22.

A position control in the entire frequency range of between 0 Hz and a few kHz is possible with the aid of the outer control loop 62. It is possible, in particular, to close a band gap in the range between 10 Hz and the first resonance peak.

The outer control loop 62 and in particular the highly sampling portion thereof enable an aliasing-free position control.

The outer control loop 62 is better accessible for maintenance work.

The outer control loop 62 includes programmable constituents. This increases the flexibility of the control.

The outer control loop 62 enables improved error checking and protective measures, in particular checking that intermediate signals are in the expected interval. A so-called pull-in of the micromirror can thus also be avoided. For example if the tilting angle of a micromirror increases to an excessively great extent or too fast, the monitoring function in the digital electronics may react and switch off the actuators in order to protect the micromirror.

The positioning of the mirror elements 23 is controlled in particular via a plurality of control channels, in particular at least two, preferably a multiplicity, in particular more than 10, in particular more than 100, in particular more than 1000. The control channels can be embodied in particular as logical data channels, that is to say as logical subdivisions, in the control data stream 68 and/or in the data channel 63. As has already been explained, at least one, in particular a plurality, in particular at least 10, in particular at least 100, in particular at least 1000, of the channels operate with a high sampling rate and a small bit depth. The sampling rate of this control channel or these control channels is in particular at least double the magnitude of the highest relevant resonant frequency of the mirror element 23 to be controlled.

The data flow from the monitoring system 75 can be divided into different channels in accordance with the data flow from the control facility 64 to the mirror array 22. The monitoring system 75 can be connected to the control facility 64, in particular to the control units 65, 66 in a data-transmitting manner in particular via fast data channels having a small bit depth and via slower data channels having a large bit depth. The bandwidths and bit depths of the fast and slow channels can correspond in particular precisely to those of the control channels between the control facility 64 and the mirror arrays 22.

The control presented above, for the purpose of controlling the positioning of the mirror elements 23, can have in each case a fast and a slow control channel for each of the mirror elements 23. It is also possible to provide separate control channels for each of the degrees of freedom of displacement of the mirror elements 23. It is also possible to generate separate control signals for each of the degrees of freedom of displacement of the mirror elements 23, in particular via the protocol generating unit 67, which control signals are combined via the supervisory unit 70 to form suitable actuation signals for each of the mirror elements 23. This may be advantageous, in particular, if more than two actuation electrodes 54 are provided for the positioning of one of the mirror elements 23.

Figure 6:
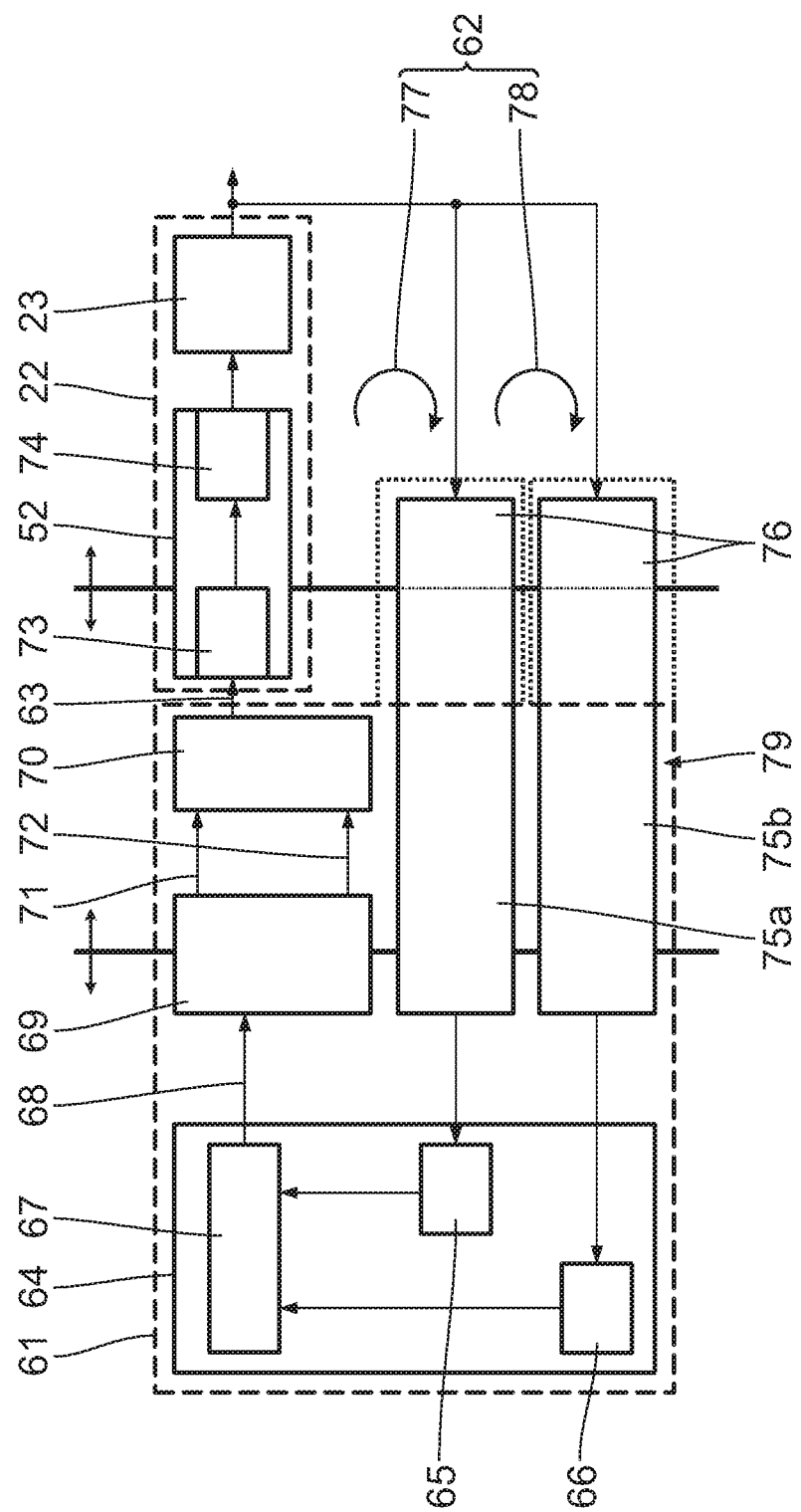
FIG. 6 shows an illustration in accordance with FIG. 5 of a control with two monitoring systems.

As is illustrated by way of example in FIG. 6, it may additionally be advantageous to provide two different monitoring systems 75a, 75b. The external sensor system 79 can include in particular a fast monitoring system 75a and a slow monitoring system 75b. As a result, it is possible to divide the monitoring, that is to say the sensing of the displacement positions of the mirror elements 23, into separate monitoring loops 77, 78. The monitoring loop 77 is also designated as fast loop. The monitoring unit 78 is also designated as slow loop. The monitoring loops 77, 78 are parts of the outer control loop 62. Together they form the outer control loop 62, in particular. Via the separate monitoring systems 75a, 75b it is possible to separate the data flow for the fast control and the data flow for the precise control of the displacement positions of the mirror elements from one another. This can be advantageous for the signal processing.

It may be advantageous, in particular, via the fast monitoring system 75a, to measure exclusively changes in the displacement positions of the mirror elements 23, in particular the time derivatives thereof, if appropriate with slower changes (drift; to be understood here as a disturbance). Slow drifts are permitted to occur in the fast control loop since the slow and more accurate control loop can balance them, in particular compensate for them.

The monitoring system 75b measures in particular the average displacement position of the respective mirror element 23, that is to say the displacement position averaged over a sampling period.

A control of the displacement positions of the mirror elements 23 on the basis of measurement data relative to an external fixed point via the external sensor system 79 leads to a better optical performance and actually makes specific novel functions possible in the first place.

Further aspects of the disclosure are described below.

In order to realize a tilting angle control via the outer control loop 62, the information transmitted from the control facility 64 to the mirror array 22 can be divided into different data flow channels.

The data channel 63 can be provided in particular with a channel structure, in particular a logical channel structure. In particular a multiplexing method can be provided for dividing the data channel 63 and/or the control data stream 68 or generally the data flow from the control facility 64 to the mirror elements 23. It is possible, in particular, to carry out in each case an adapted, optimized coding for reducing the data rate in the different communication channels. The control algorithm in the individual channels can differ in this case.

Advantageous alternatives for the separation of the individual communication channels are one or more of the following alternatives: time slot implemented separation (Time Division Multiple Access—TDMA), frequency slot implemented separation (Frequency Division Multiple Access—FDMA), a code multiplexing method (Code Division Multiple Access—CDMA) or a space multiplexing method (Space Division Multiple Access—SDMA), in which different hardware units are provided for communication links.

Generally, provision can be made for dividing the controller information from the control facility 64 to the mirror arrays 22 into different digital communication channels 80$_i$. The corresponding architecture is illustrated schematically in FIG. 7. As is additionally illustrated schematically in FIG. 7, the control facility 64 includes a Tx channel coding unit 81. The Tx channel coding unit 81 can be embodied as DSP, FPGA, CPU, ASIC or the like or include such components.

The Tx channel coding unit 81 is connected to a corresponding Tx channel decoding unit 82 via the communication channels 80$_i$. The decoding unit 82 can be embodied in the optical component, for example on the ASIC 52, or as part of the supervisory unit 70. It is connected to the digital-to-analog converter 73 via the data channel 63. It can optionally have a feedback data connection 83 to an Rx channel coding unit 84. The Rx channel coding unit 84 obtains its input signals from the monitoring system 75 for example via an analog-to-digital converter 85.

The Rx channel coding unit 84 and/or the analog-to-digital converter 85 can be parts of the MEMS system. In particular, they can be embodied on the ASIC 52. They can also be embodied as parts of the external sensor system 79.

The Rx channel coding unit 84 is connected to an Rx channel decoding unit 87 in a data-transmitting manner via communication channels 86$_i$, in particular digital communication channels 86$_i$. The Rx channel decoding unit 87 can be embodied in particular as DSP, FPGA, CPU, ASIC or the like or include such components. In particular, it is part of the control facility 64. It is connected to the Tx channel coding unit 81 in a data-transmitting manner via a supervisory unit 93, which in particular is likewise embodied as DSP, FPGA, CPU or the like or includes such components.

Figure 7:
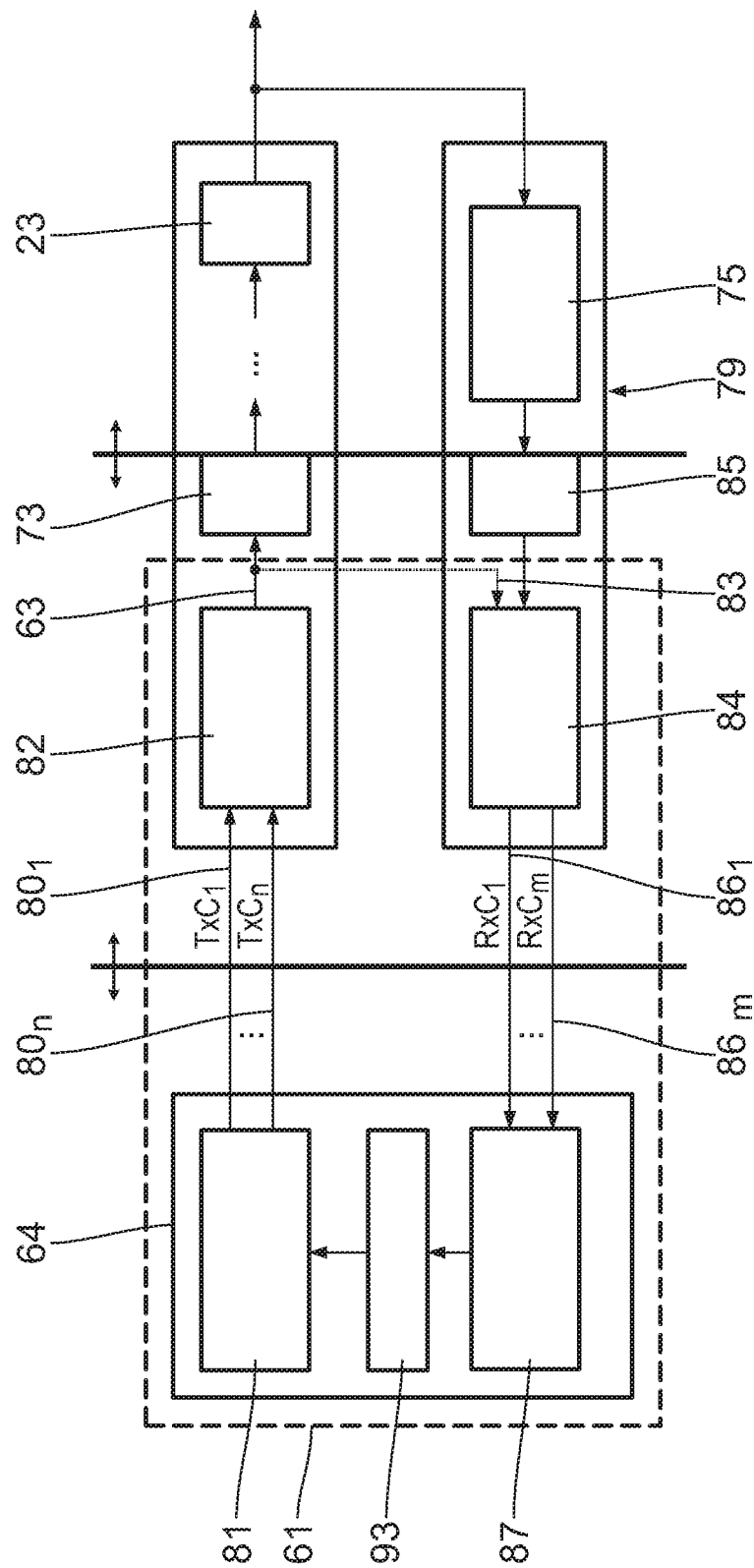
FIG. 7 shows a further schematic illustration of a control with separate communication channels.

The functioning of the controller architecture in accordance with FIG. 7 is described below. The controller information, that is to say the respective actuation and measurement information, is divided into different communication channels 80$_i$, 86$_i$. In particular the information which is transmitted by one or more external controller computing units, in particular from the control facility 64 to the MEMS units, in particular to the mirror elements 23, is not a single data flow for each MEMS channel, rather each of these MEMS channels also has once again intrinsically a logical subdivision. To put it another way, the logical MEMS channels are transported in each case in a bundled manner in communication channels.

By way of example, a separation of the communication channels 80$_i$ is illustrated in FIG. 7. In this case, the communication channel 801 (TxC$_1$) can be the channel for the fast signal, that is to say the signal having the high bandwidth, for the damping of one or more of the mirror elements 23. The coding of this signal can be effected by the limitation of the range of the signals for reducing the required bits, that is to say by the limitation of the bit depth of this signal. The damping effect generally involves only very small forces/moments in comparison with the positioning forces and/or moments. Therefore, the range of these damping actuating signals can be greatly limited, and a small number of bits suffice for the transmission.

A second communication channel 802 (TxC$_2$) can transmit a slow signal for exact position control. Since only a slow control is effected here, the actuating signal can be transmitted with full bit width, that is to say with high resolution, without separate coding.

Figure 5:
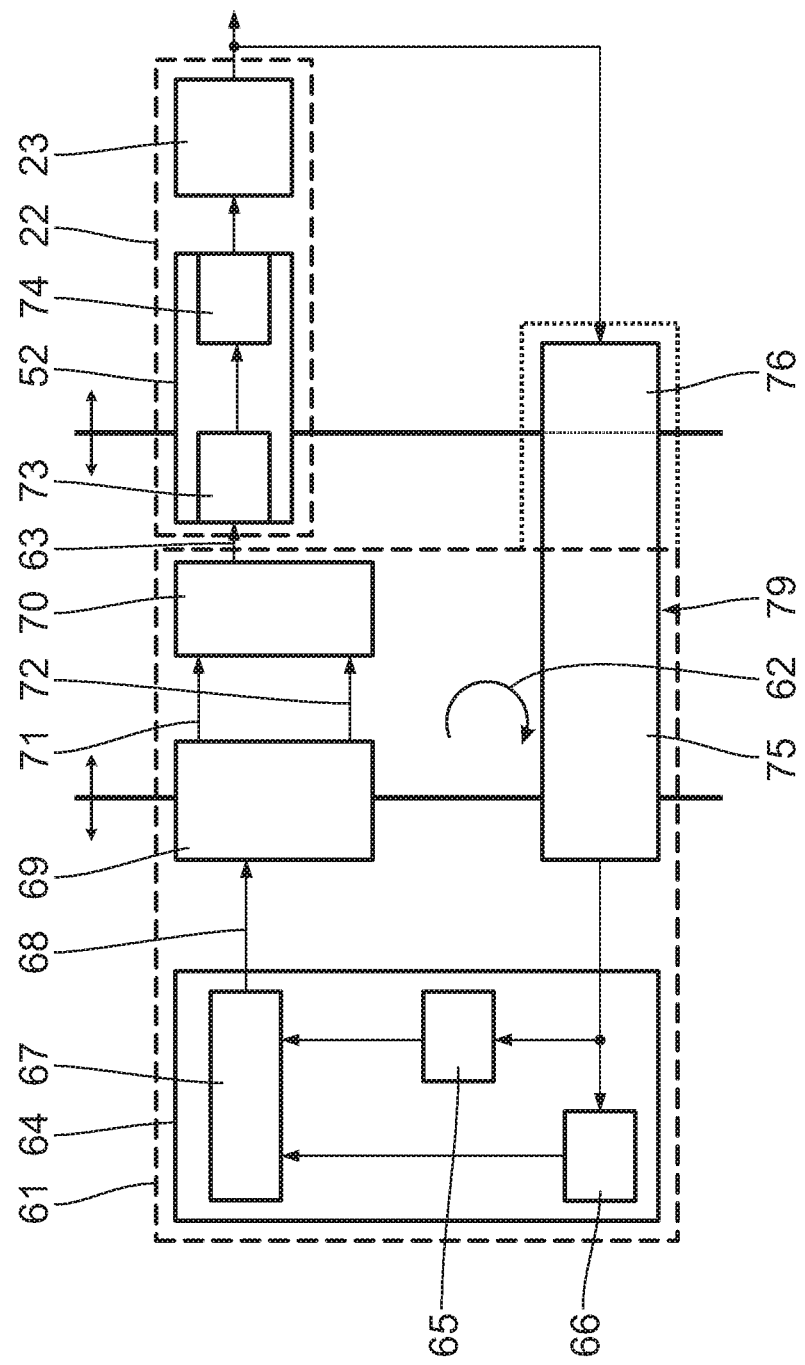
FIG. 5 shows a schematic illustration of the control of the positioning of mirror elements of a multi-mirror arrangement.

The communication channels 80$_i$, as already mentioned with reference to FIGS. 5 and 6, can be embodied as physically separated links. As described in association with FIG. 7, they can also just be logically separated.

In order to realize a tilting angle control via the outer control loop 62, one or more of the following possibilities can be provided:
1. The information to be transmitted can be divided into different data flow channels. In other words, the data channel 63 can be provided with a channel structure, in particular a logical channel structure. A multiplexing method, in particular, is provided for this purpose.
2. An individual coding or compression of the signals is effected with respect to each of the mirror elements 23. This is also designated as channel-specific coding/compression, in particular as MEMS-channel-specific coding/compression. In this case, an MEMS channel should be understood to mean the multiplicity of data channels to the mirror elements 23 of one and the same MEMS mirror array 22. It is also possible to provide a coding/compression for each tilting angle axis, in particular for each degree of freedom of displacement.
3. The measurement and controller information of a plurality of MEMS channels is coded and/or compressed in a bundled manner.

The different possibilities for control via the outer control loop 62 are explained in greater detail below.

By way of example, the limitation of the range of the controller signals, in particular by the limitation of the bit depth thereof, was mentioned as coding. That was based on the insight that, for damping the mirror elements 23, the controller or actuating signals have to include only a very small range since only small disturbances have to be corrected for the purpose of damping. A sufficiently fine quantization is thus provided even with a small number of bits, that is to say with a small bit depth. This will be explained in even more detail below.

The coding of the communication channels 80$_i$, 86$_i$ can also be extended. It is possible, in particular, to perform further codings of the communication channels 80$_i$, 86$_i$ instead of or in addition to the limitation of the bit depth. The coding serves in particular for reducing the number of bits of the signals to be communicated that is to say for reducing the data flow to be transmitted overall. The coding serves in particular for compressing the signals, that is to say for compressing the data flow. A controller architecture having such a compression is illustrated by way of example in FIG. 8. The architecture of the control device 61 substantially corresponds to the architecture of the device 61 in accordance with FIG. 7. In order to clarify the concept according to which the coding is used for compressing the signals, the coding units 81, 84 are designated as Tx compression unit 88 and Rx compression unit 89, respectively. Correspondingly, the decoding units 82, 87 are designated as Tx decompression unit 90 and Rx decompression unit 91, respectively. Moreover, FIG. 8 clarifies by way of example that the communication channels 80$_i$, 86$_i$ can be physically embodied in each case as a single data use.

A description is given below of different coding and/or compressing variants which have proved to be advantageous for the control of the positioning of the mirror elements 23: the limitation of the dynamic range, in particular of the bit depth of the signals, has already been mentioned.

A differential transmission of the control signals can also be advantageous. This can mean that exclusively controller errors are transmitted or that only the change relative to the respective temporally preceding value is transmitted.

A further advantageous coding consists in merely transmitting a signal with respect to the slope of the signal waveform (Slew Rate). This corresponds to an instruction to the decoding unit in particular to rise rapidly or slowly, to fall rapidly or slowly or to remain constant, that is to say five states, for example, which can be represented by 3 bits.

A further advantageous coding consists in a nonlinear quantization of the signals. This will be described in even more detail below.

A further advantageous coding consists in a vector quantization, in particular in the x-y-tilting plane. In this case, provision can be made, instead of quantizing the x- and y-tilts separately, for providing arbitrary quantization regions in the x-y-tilting plane.

A further coding can consist in a vector coding. In this case, the only information transmitted is that regarding which signal segments the decoding unit desirably respectively selects from a signal waveform catalogue. This will be described in even more detail below.

A further advantageous coding variant consists in limiting the frequency ranges. This can be advantageous particularly in the case of MEMS mirrors since the objective in the case of MEMS in high vacuum usually consists in damping a few resonances. Via a limitation to the most important resonances, in particular for example by virtue of the fact that only information in the vicinity of defined Fourier coefficients is transmitted, a high reduction of the bit rate can be achieved. In the case of limitation to resonances, a distinction can be drawn in particular between two variants: the limitation is effected with fixedly parameterized resonances, or the crucial frequencies are extracted from the signals, for example from the current power density spectrum.

A further advantageous coding consists in limiting the information transport to signal contents with regard to different basis functions than in Fourier decomposition. In particular, functions other than sine or cosine functions serve as basis functions. The signal contents can be quantized with regard to the new basis. The basis functions can be chosen in particular in such a way that the signal has a particularly high content with regard to a predefined set of basis functions.

Further coding variants consists in a coding according to the entropy method or in accordance with a Golomb-Rice coder.

Figure 9:
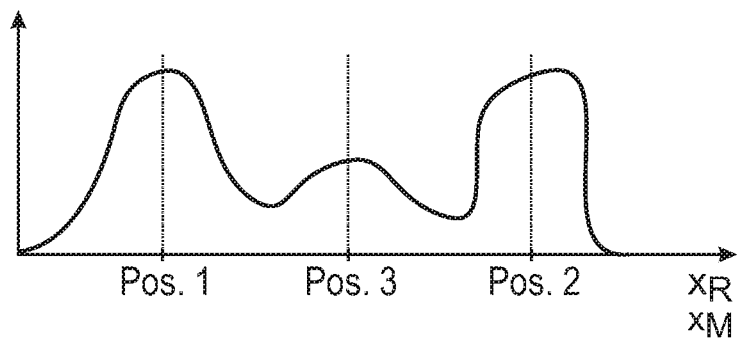
FIGS. 9 and 10 show schematic illustrations of a nonlinear quantization for data reduction.

A description is given below, with reference to FIGS. 9 and 10, of a coding and/or compression, that is to say data reduction, via a nonlinear quantization. FIG. 9 illustrates by way of example a probability density of a controller actuating value $x_R$ or a measurement variable $x_M$ versus the corresponding controller actuating value $x_R$ or the measurement variable $x_M$. As is illustrated by way of example in FIG. 9, a nonuniform, that is to say a nonlinear, quantization is provided. The quantization of the controller actuating values $x_R$ or the measurement variable $x_M$ is adapted to the probability density within the corresponding interval. In particular, a resolution is provided which is all the higher, the higher the probability density in a specific region. Conversely, a resolution is provided which is all the lower, if the probability density in the region is low. The probability density illustrated by way of example in FIG. 9 corresponds for example to the positioning of a mirror element 23 which is arranged particularly frequently in one of the positions 1 or 2, somewhat less frequently in a position 3 and only relatively rarely in positions deviating therefrom.

A nonlinear quantization can also be provided in a multidimensional fashion. In particular, it is possible to provide a vector quantization with a two-dimensional probability density for x and y.

The quantization intervals and/or levels can be optimized. They can be optimized for example for a minimum mean square error or a maximum entropy for a predefined number of quantization levels.

A nonuniform or nonlinear quantization is advantageous in particular if the range of the variables to be controlled is limited and/or if the probability of occurrence is very high around some specific values and decreases very greatly outside these probably ranges.

The number of bits to be transmitted can be considerably reduced via a nonlinear quantization.

By way of example, the current tilting angle is differentiated in the active damping of the mirror elements 23. In the case of vibrations around a constant average tilting angle and in the case of slow drifts, this has the effect that the damping driving variable as a time derivative of the tilting angle then fluctuates around the value 0. Since the vibrations are generally rather small, particularly high driving forces are not required. In other words, higher driving forces become less and less probable. This is manifested in the fact that the probability density of the driving variable, for example the time derivative of the tilting angle, is highest at 0 and falls greatly toward higher absolute values. The probability density can have the shape of a Gaussian distribution, for example, as is illustrated by way of example in FIG. 10. If the occurrence of specific values can be excluded, for example, that is to say if the probability of the occurrence of the values is identical to 0, the distribution can be set to 0 starting from a specific absolute value. Such values then definitely do not occur or cannot then contribute to the control.

Considerations similar to those for the time derivative of the tilting angle also apply to the control difference. The control difference, in particular the control difference for a disturbance variable correction given a fixedly set tilting angle, generally assumes only very small values, that is to say values close to 0.

Figure 10:
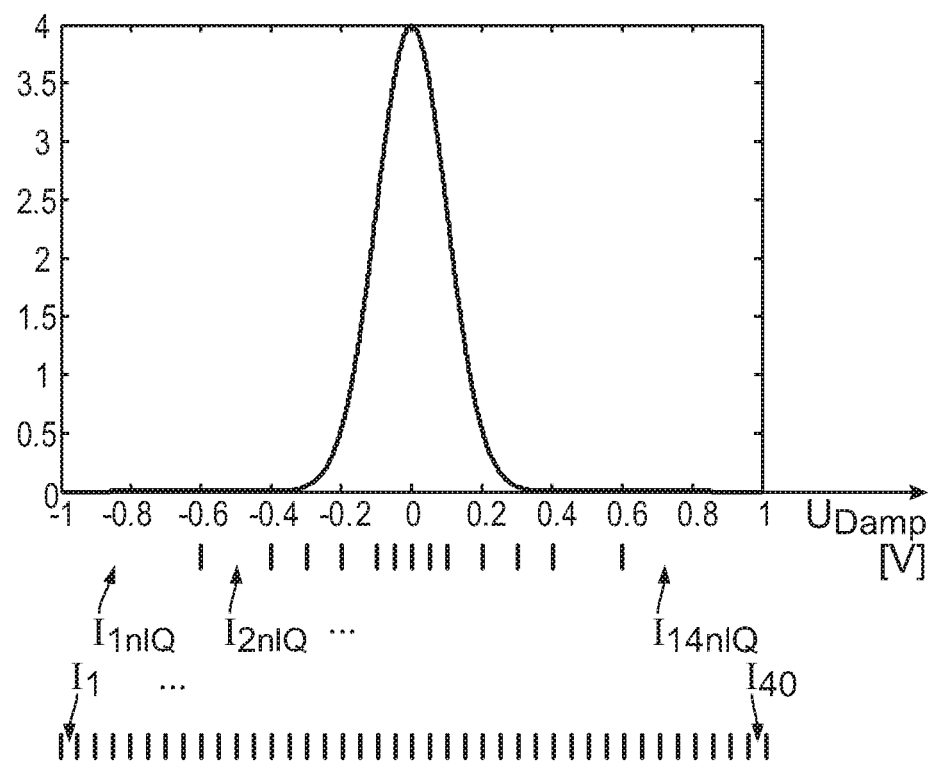

FIG. 10 illustrates a nonlinear quantization of the nonnormalized probability density of the electrode voltage $U_{Damp}$. A nonlinear quantization with 14 quantization intervals $I_{1nlQ}, I_{2nlQ} \ldots I_{14nlQ}$ is illustrated by way of example. These 14 quantization intervals $I_{inlQ}$ can be represented with a 4-bit signal for $U_{Damp}$.

For comparison, a linear quantization of $U_{Damp}$ is illustrated which has the same precision in the region of the highest probability density. The linear quantization of the region illustrated uses 40 quantization intervals $I_1 \ldots I_{40}$, that is to say a 6-bit signal. This example serves merely to illustrate the potential of nonlinear quantization. The actual potential of nonlinear quantization is even higher still. Specifically, in FIG. 10 a limitation of the range had implicitly already been performed in the case of the linear quantization as well, which already constitutes a first form of nonlinear quantization.

Figure 11:
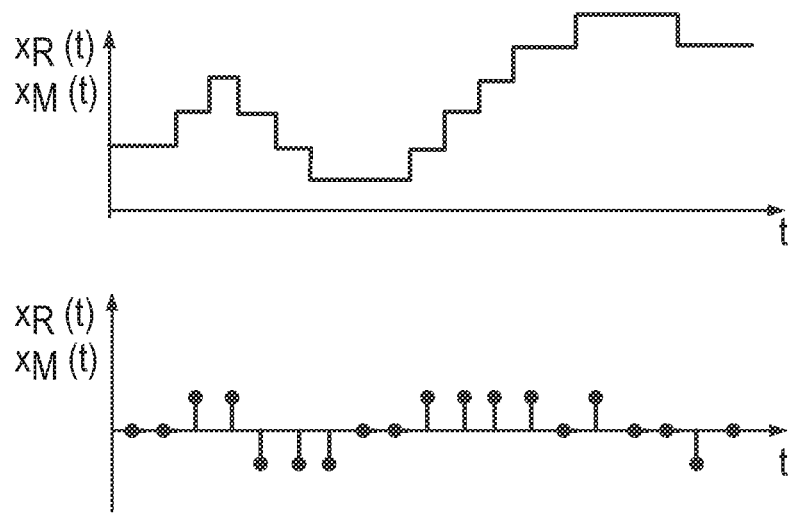
FIG. 11 shows a schematic illustration for clarifying a differential coding for data reduction.

The principle of differential coding is explained in greater detail below with reference to FIG. 11. A temporal profile of a controller actuating value $x_{R(t)}$ or a measurement variable $x_{M(t)}$ is illustrated by way of example in the upper part of FIG. 11. The corresponding time profile $x_R(t)$ or $x_M(t)$ is illustrated in the lower part of FIG. 11. In the form illustrated, it is merely necessary to transmit the information as to whether the signal rises, remains constant or falls. In other words, it suffices to code three states. Just two bits are used for this.

So-called slew rate coding is based on a similar principle. The information as to whether the actuating signal remains constant, rises or falls is transmitted just with a few bits. With additional bits it is then also possible to distinguish a few rates of rise and/or fall of the actuating signal, in order to represent and transmit signal profiles better.

Figure 12:
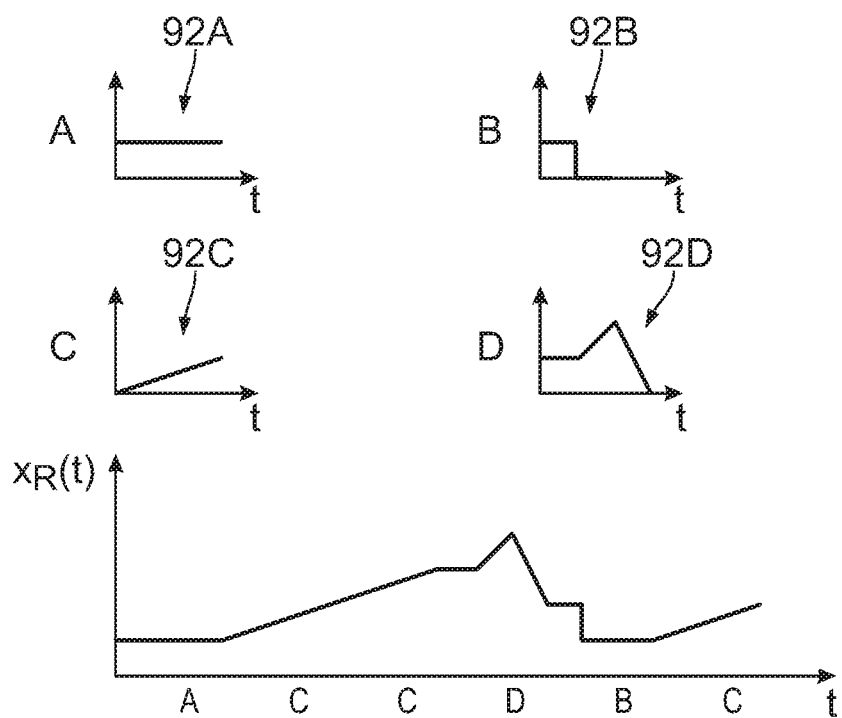
FIG. 12 shows a schematic illustration of a vector coding for data reduction.

Vector coding is explained in greater detail below with reference to FIG. 12. Depending on the signal waveform, a vector coding can lead to a very efficient data compression in conjunction with a good representation of the signal waveform. FIG. 12 illustrates again by way of example the time profile of a controller actuating value $x_R(t)$ or of a measurement variable $x_M(t)$. Four signal waveforms, (A, B, C, D) are illustrated by way of example in the upper region of FIG. 12. The signal waveforms are also designated as signal segments 92A, 92B, 92C, 92D. Below the time axis of the time profile of $x_R(t)$ or $x_M(t)$, the illustration indicates how this profile can be coded by the four signal waveforms A, B, C, D. The shape of the signal segments $92_i$ can be adapted in particular to the expected time profiles of the controller actuating values or measurement variables. In particular, a catalogue of signal segments $92_i$ which correspond to parts of sinusoidal oscillations at the resonant frequencies of the mirror elements 23 is conceivable. The reason for this is that, in the case of vibrations, resonances are often excited exclusively or as a majority. Actuating variables are then usually also sinusoidal oscillations (having a varying amplitude) at the resonant frequencies.

The disclosure provides for the MEMS-channel-specific coding to include the coding specific to each tilting axis, but also the combined coding of the tilting axes. Instead of transmitting an x- and a y-controller signal, it can be advantageous to code the signal in respect of absolute value and direction and then to perform an optimized quantization there. A vector coding in the x-y-plane can also be advantageous. The catalogue of signal segments then consists of 2D trajectories over the time axis instead of 1D signal profiles over the time axis.

A description is given below, with reference to FIG. 13, of the principle of the bundled coding or compression and the associated controller architecture.

While the control and coding methods considered above were limited to a consideration of individual mirrors or individual tilting axes within the mirror array 22, it is also possible to code a plurality of MEMS channels in a bundled fashion. This is advantageous in particular if there are correlations between the deflections of the mirror elements 23, in particular the disturbances thereof to be damped. If, for example, the mirror array 22 overall experiences a disturbance, it may suffice to transmit only a single tilting angle error for the entire mirror array 22 as controller information from the control facility 64 to the mirror array 22.

Figure 8:
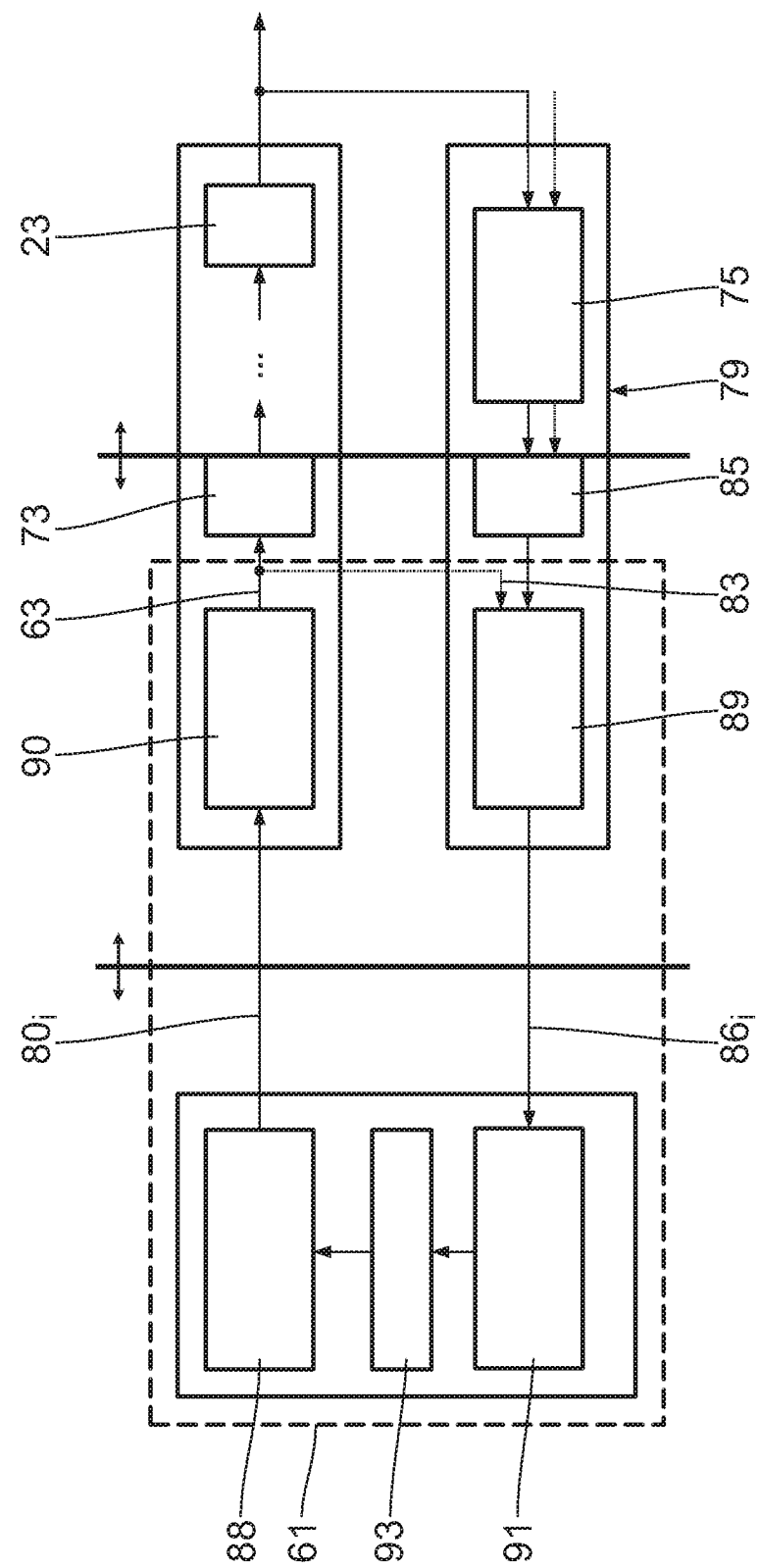
FIG. 8 shows a further illustration of a control with compressed data transmission.
Figure 13:
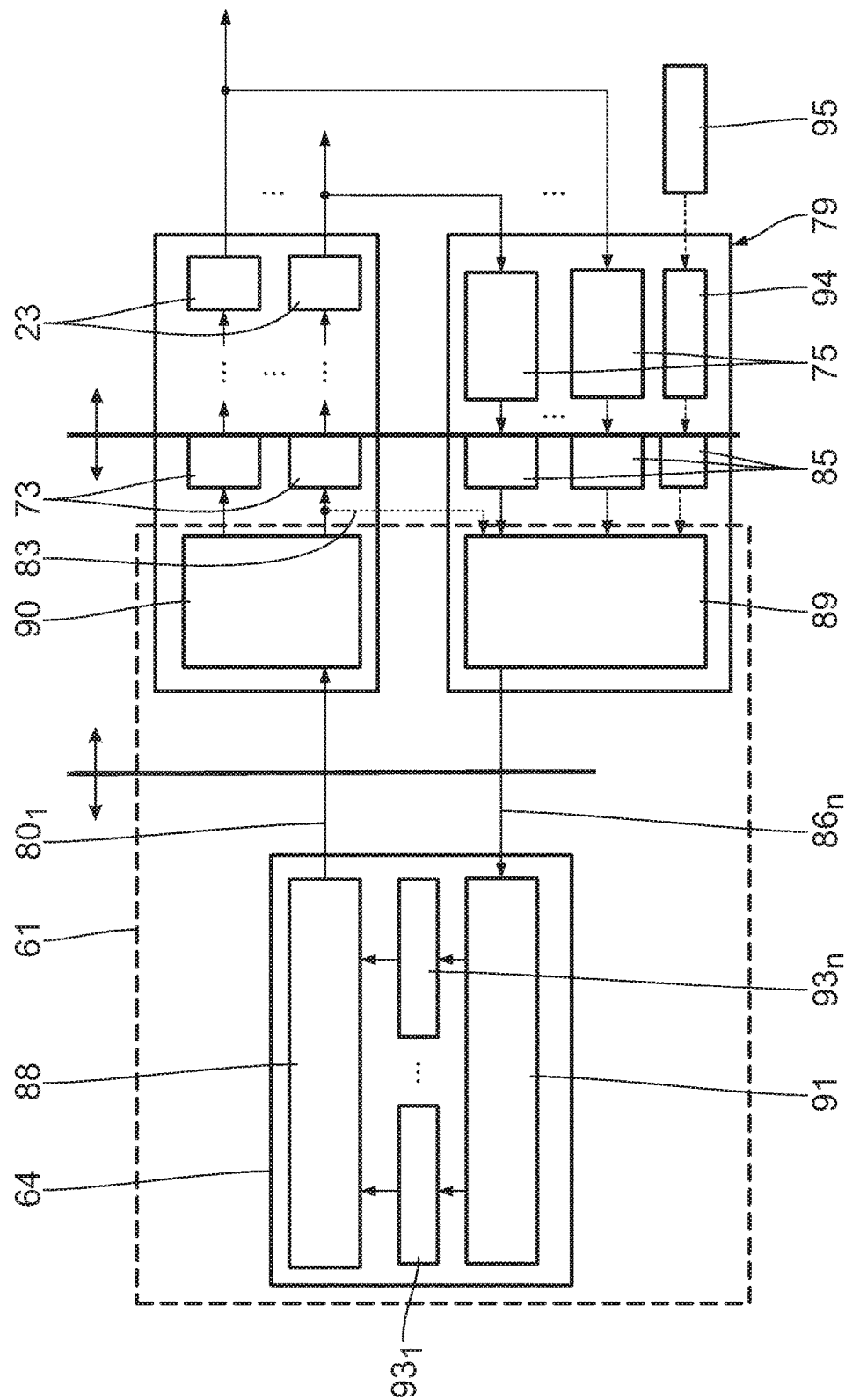
FIG. 13 shows a schematic illustration of a control with bundled coding and compression.

The architecture of the control device 61 as illustrated in FIG. 13 substantially corresponds to the architecture of the control device 61 in accordance with FIG. 8, to the description of which reference is here by made. In the case of the control device 61 in accordance with FIG. 13, the control facility 64 includes in particular a multiplicity of supervisory units $93_1 \ldots 93_n$.

The compression algorithm processes the information, that is to say the control signals to and/or from a plurality of the mirror elements 23, in particular all the mirror elements 23, of one of the mirror arrays 22, in particular all the mirror arrays 22, simultaneously or in a bundled fashion. As a result, it is possible to considerably reduce the data flow, that is to say the volume of data to be transmitted overall per unit time between the control facility 64 and the mirror elements 23. On the other hand, in this case, the information for the control of the individual mirror elements 23 or the degrees of freedom of displacement thereof can be completely reconstructed in the decompression units 90, 91. It is also possible for the information for controlling the mirror elements 23 to be reconstructed only partly, that is to say incompletely, in the decompression units 90, 91 if this is sufficient for the demanded controller performance.

The external sensor system 79 can include further sensors 94 in addition to the monitoring systems 75. The sensors 94 serve in particular for detecting one or more variables for characterizing the ambient conditions of the mirror elements 23. These variables are provided with the reference sign 95 in a manner combined schematically in FIG. 13.

By way of example, it is possible, for the purpose of data reduction, to transmit to all of the mirror elements 23 a signal which corresponds to an average tilting angle error, that is to say to an average value of the tilting angle errors of all the mirror elements 23, and, for each of the individual mirror elements 23, in each case the individual deviation from the average tilting angle error. These deviations of the individual mirror elements 23 of the same mirror array 22 can be coded with significantly fewer bits than the total deviations. The savings in data flow volume are similar to those in the case of differential coding. However, differentiation with respect to time is not effected here, rather differential coding over a plurality of bundled data channels is effected. The individual deviation of each of the individual mirror elements 23 from the average value can be represented and transmitted with a small number of bits.

Figure 14:
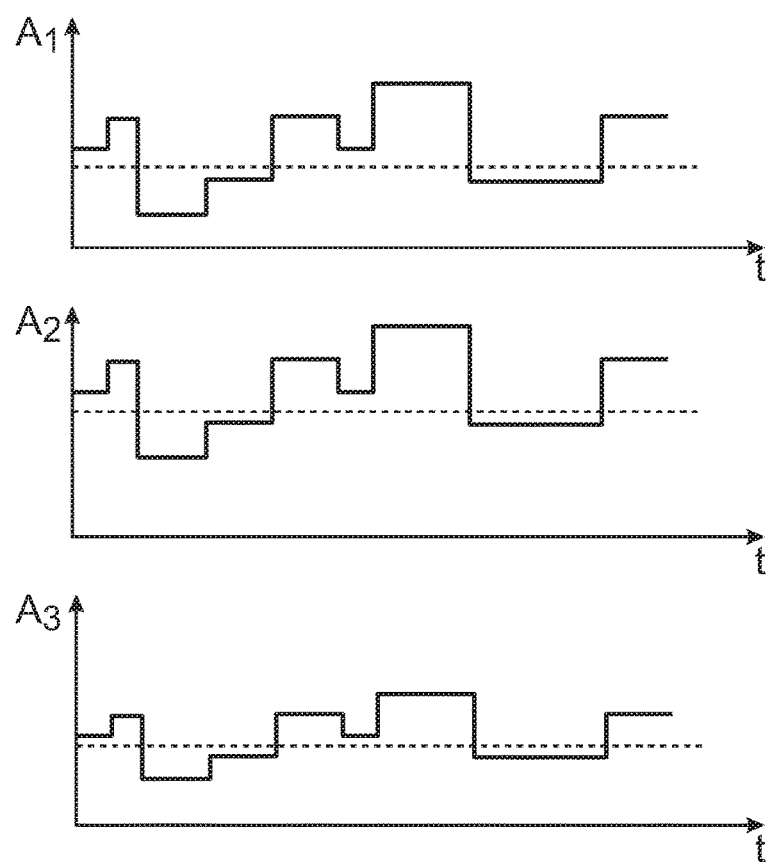
FIG. 14 shows a schematic illustration of the data reduction in the case of correlated signals.

This is clarified again with reference to schematic FIG. 14. FIG. 14 illustrates by way of example the time profile of three signals $A_1, A_2, A_3$ to be transmitted. The signals $A_i$ can for example once again represent controller actuating values or measurement variables. In order to clarify the principle of bundled coding, it should be assumed that the signals $A_i$ are correlated with one another. It holds true in particular that:
$A_2 = B_2 \cdot A_1 + C_2$ and
$A_3 = B_3 \cdot A_1 + C_3$, wherein $B_i$ is in each case a constant and $C_i$ should likewise be assumed to be a constant. Generally, $C_i$ can be a time-dependent signal. However, the signals $C_i$ generally have a smaller amplitude than the output signals $A_i$. FIG. 14 serves merely to illustrate the basic principle of bundled compression. Alternative coding methods, for example a standard MPEG method, are likewise possible for compression.

A two-dimensional coding, 2D coding, is also conceivable. Such a 2D coding is based on the concept of compressing the information of all tilting angles and/or driving variables for a mirror array 22 in a manner similar to an image at a given point in time, that is to say without the use of temporal relationships in this compression step. In the case of a mirror array 22 having 64·64 mirror elements 23 which are controlled in each case with regard to two axes or positions, this corresponds to an image having 64·64·2 pixels=8192 pixels which is compressed before being transmitted from the control facility 64 to the mirror array 22.

If, for example, in an optical application with the majority of the mirror elements 23 of a mirror array 22, for example with 3500 mirror elements 23, of a mirror array 22 including 64·64 mirror elements 23, the shapes of globally curved optical elements are simulated, then many mirrors are at a similar tilting angle. In particular, neighboring mirror elements 23 are at very similar tilting angles. In such a situation, the application of a deflate algorithm, for example in accordance with the method for generating an image in the PNG-, TIFF- or GIF-format, can also be used. In some embodiments, the deflate algorithm predicts, inter alia, the value from one pixel to the next and stores or codes only the prediction error. The algorithm works very efficiently in regions with mirror elements 23 whose tilting angle differs little from that of the neighboring mirror element 23. It can be used for compression both of the tilting angle data and of the control difference and also in the case of derived variables, in particular in the time derivative of the tilting angles.

Many further methods for efficiently compressing such information are known from the field of image compression. This may involve a lossless or a lossy compression. The reduced volume of data enables a transmission of the information with low latencies and thereby enables a fast control for actively damping the mirror elements 23.

The compression can for example also be applied to the tilting angles or other measurement variables determined via the sensor system 79. It can also be applied to derived control variables, in particular the control difference or the time derivative of the control difference. Since the mirror elements 23 having comparable displacement positions usually also experience similar disturbances, for example as a result of vibrations, the 2D compression outlined above can also be applied very efficiently to such variables which do not directly represent the tilting angles themselves, but rather are derived from the current tilting angles, for example the time derivative or the control difference.

A further advantageous coding method is described below. It has been recognized according to the disclosure that in a similar manner to that in the step of an image frame compression for the compression of a video stream also in the compression of the driving variables within the outer control loop 62, in particular within the fast tilting angle control, the information from the past, in particular the information about the temporal evolution of the tilting angles, in particular the information of the last preceding point in time, can be used to compress the current information. It has been recognized, in particular, that it can be advantageous to extend the bundled coding over a plurality of the mirror elements 23 also over the temporal dimension. This is advantageous in particular since the dynamic behavior of the mirror elements 23 can be described well using models.

One example of a disturbance variable which leads to temporally strongly correlated controller errors between individual channels and thus to strongly correlated communication signals is excitations by pulses or pulse sequences of the illumination radiation 14. In this case, the signal waveform is structurally very similar for the different mirror elements 23. However, it can differ in direction and amplitudes between the individual mirror elements 23. However, the direction and amplitude can be derived at least partly directly from the tilting angle setpoint values. If the constant setpoint values of the coding unit 81 and of the decoding unit 82 are present, it may suffice, for example, to transmit only a single specimen controller signal for each mirror array 22. The decoding can then be carried out individually with inclusion of the here temporally constant tilting angle setpoint value for each of the mirror elements 23. In one advantageous embodiment, it is additionally possible also to transmit variations between the individual mirror elements 23 within a mirror array 22. Since these are only small model deviations, however, this information can in turn be coded with a small number of bits. In this regard, reference should be made to the above description of differential transmission.

Very fast sampling has to be effected in the case of an active damping of the mirror elements 23. This has the effect that tilting angle changes between two successive sampling times are rather small. Therefore, in order to reduce the data flow it is advantageous to transmit only the change in the tilting angles from the control facility 64 to the mirror array 22. The change in the tilting angle over time, that is to say the difference between the tilting angle values at two successive points in time, is limited in terms of range. In other words, the probability density of the changes is such that only small regions of the possible tilting angle range have to be transmitted and thus quantized. The nonlinear quantization outlined above can be applied beneficially here. The number of used bits is greatly reduced by this temporal compression.

In order to further reduce the volume of data, in a subsequent step the 2D compression outlined can then be applied to the already reduced data set.

Figure 16:
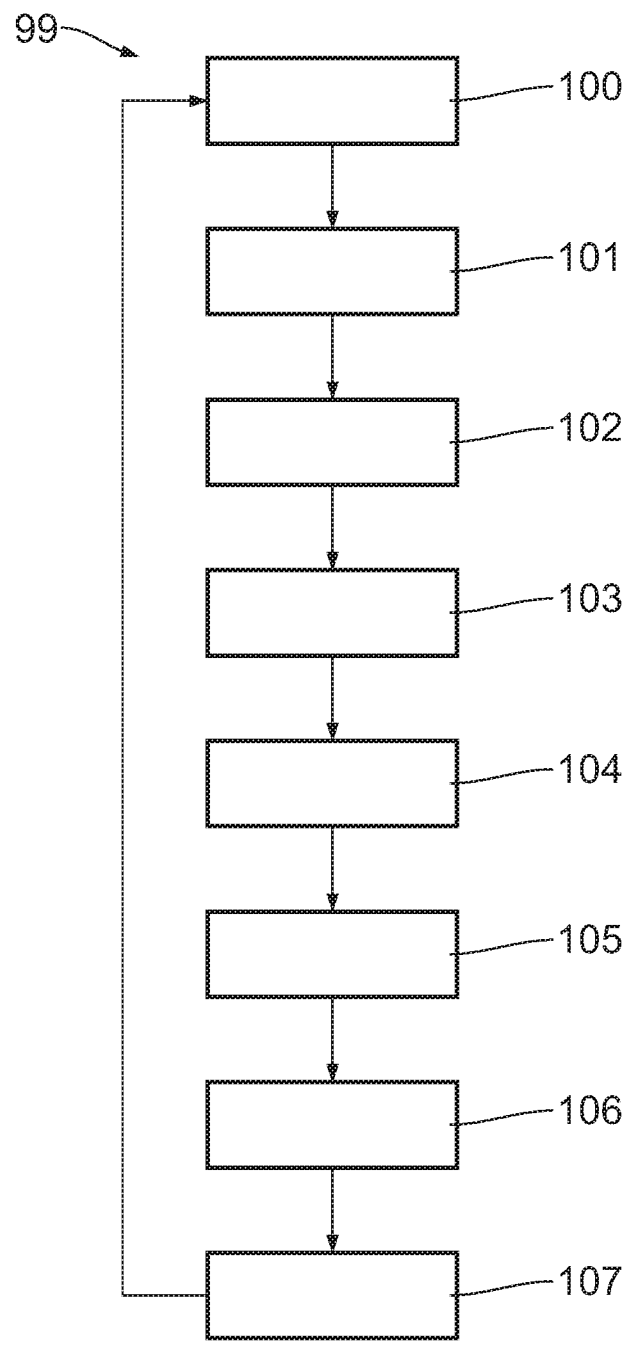

Such a combination of a 2D coding with addition of a temporal aspect, that is to say with inclusion of the temporal dimension, is also referred to as 3D coding. A control sequence 99 on the basis of the sequence of a 3D coding at the sampling time n is outlined again below with reference to FIG. 16. Firstly, the current tilting angles of the mirror elements 23 are measured in a measuring step 100. The sensor system 79, in particular, serves for measuring or detecting the tilting angles.

The tilting angles of the x·y mirror elements 23 of the mirror array 22 at the time n shall be designated by $\alpha(x,y,n)$.

For the following discussion it shall be assumed that the tilting angles $\alpha$ and their differences $e(x,y,n):=a(x,y,n)-\alpha(x,y,n-1)$ shall be quantized using 16 bits. A quantization deviating therefrom is possible, of course.

After measuring step 100 next the differences $e(x,y,n)$ are calculated in a differential step 101.

Afterward, in a temporal compression step 102, a data set $e_{quant}(x,y,n)$ is calculated by limitation of the value range of the differences $e(x,y,n)$ and nonlinear quantization within the limited value range. By way of example, just five bits per pixel suffice for the data set $e_{quant}(x,y,n)$.

Afterward, in a spatial compression step 103, the data set $e_{quant}(x,y,n)$ is compressed by 2D image compression, in particular by a deflate algorithm. As a result, the volume of data can be reduced again for example to one fifth. Consequently, after temporal compression step 102 and spatial compression step 103, on average only 1 bit per pixel is present instead of 16 bits per pixel. The corresponding data set shall be designated by $e_{comp}(x,y,n)$. The total volume of data was thus able to be significantly reduced. Afterward, the data set $e_{comp}(x,y,n)$ is transmitted from the control facility 64 to the mirror array 22 in a transmission step 104. The data set $e_{comp}(x,y,n)$ is transmitted in particular to the decoding unit 82 or the decompression unit 90. Here the data $e_{comp}(x,y,n)$ are unpacked, that is to say decoded and/or decompressed. In other words, the compressed data set $e_{comp}(x,y,n)$ is decoded and/or decompressed in a decoding step or decompression step 105 and the original data set $e(x,y,n)$ is calculated.

On the basis of the data set $e(x,y,n)$, the actuating variables are updated with new information $e(x,y,n)$ or $\alpha(x,y,n)$ in an updating step 106. That is to say that the actuators of the mirror elements 23 are driven with the updated values.

In a subsequent update step 107, the values of the tilting angles α in the coding unit 81 are brought to the new values, that is to say the values at the time n, that is to say to the values α(x,y,n).

The control cycle 99 is then begun again with the next measuring step 100.

At a data rate of 100 Mbit/s for each of the mirror arrays 22 it is possible to transmit 8192 bits in approximately 0.08 ms. For a mirror element 23 having a resonant frequency of 100 Hz, the transmission time of approximately 0.08 ms would correspond at resonance to a phase loss of approximately 2.88°. For an active damping at resonant frequency, this is in the realistic range and still permits a degree of latitude for further latencies in the control loop 62. Such latencies can be used for example for the tilting angle measurement and/or the data compression and/or the data decompression.

In a manner similar to that in image compression, it is also possible to use models for representing the temporal and spatial changes in the tilting angles in combination. In this context, the spatial coordinate denotes the position of the mirror element 23 in the mirror array 22.

If, for example, a type of tilting angle disturbance wave propagates spatially on the mirror array 22, this can be used as a basis for a further data reduction via improved predictions of the tilting angles, in a manner similar to the shifting of image blocks in image compression. Prediction in this context means that the tilting angles at a given point in time are predicted from those of the preceding points in time, in particular from those of the directly preceding point in time, in order that only prediction parameters and prediction errors have to be transmitted. The receiver, in particular the decoding or decompression unit 82, 90 or the supervisory unit 70 or the electronics of the ASIC 52 knows the prediction model and can extract the full information, in particular extract it losslessly, from the prediction parameters and the prediction error.

A description is given below, with reference to FIG. 15, of a further method which can be used to improve the coding and decoding of the controller signals. The coding and decoding need not necessarily be grouped according to physical units. Depending on addressing methods for the data transmission facility, the coding/decoding packets can also be arranged via re-sorting such that the data reduction is optimal. This can be done for example via a clustering of mirror elements 23 having similar tilting angle setpoint values in the x- and/or y-direction and/or mirror elements 23 having similar tilting angle absolute values and/or mirror elements 23 having similar tilting angle directions.

Figure 15:
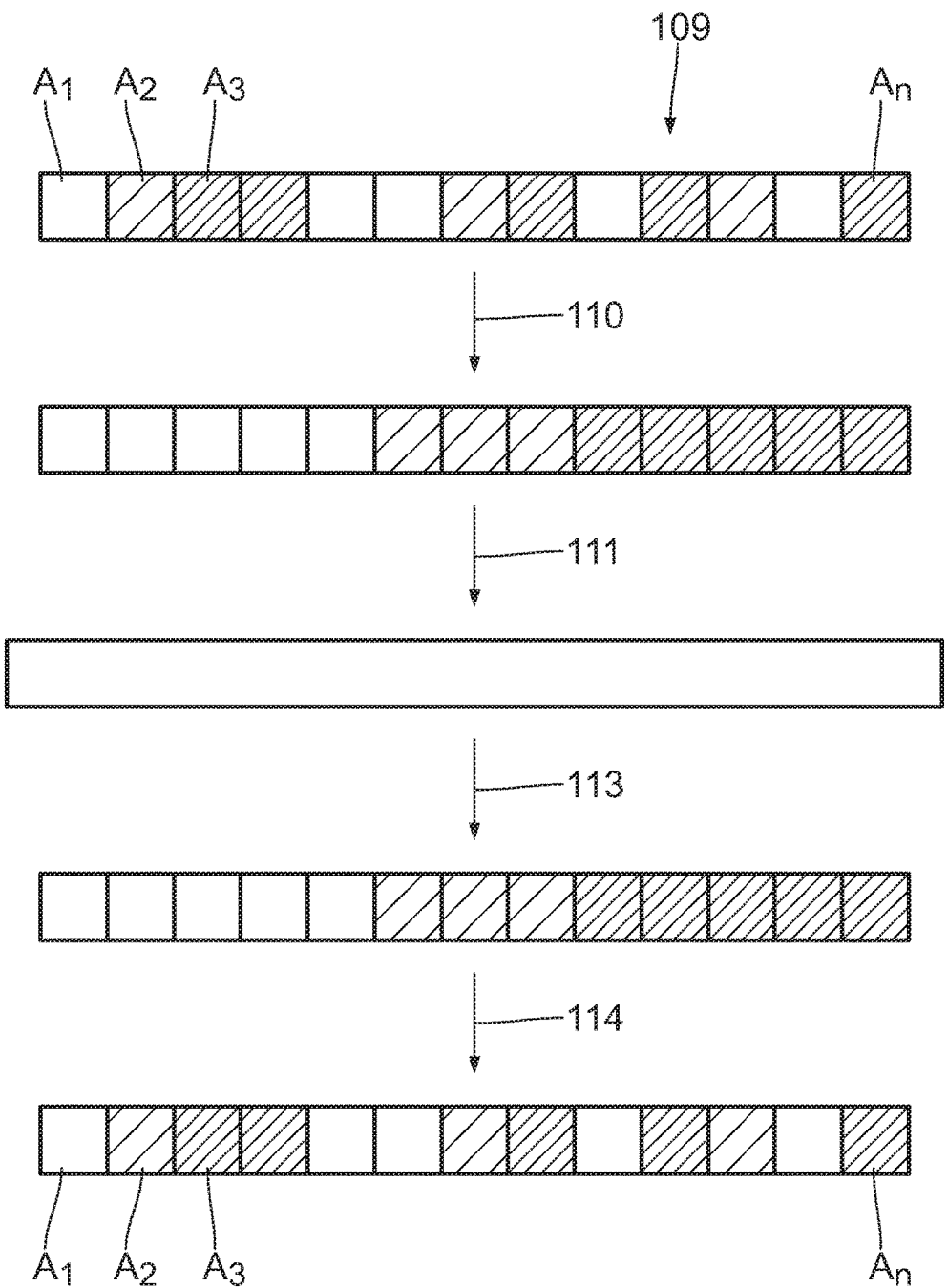
FIG. 15 shows a schematic illustration of a data compression using a re-sorting of the signal constituents, and FIG. 16 schematically shows the sequence of a 3D coding.

FIG. 15 elucidates by way of example how a better compression efficiency can be achieved by re-sorting the controller signals in the coding unit. A vector 109 with the signals $A_1, A_2, A_3 \ldots A_n$ to be transmitted serves as output signal.

In a permutation step 110, the elements of the vectors 109 are permuted via a permutation matrix M. The elements of the vector 109 are permuted in particular in such a way that similar, in particular identical, signals become adjacent. The permuted vector 109 thus has regions, in particular continuous regions, having similar, in particular identical, signal constituents.

Afterward, the permuted vector is compressed in a compression step 111.

Afterward, the compressed vector is transmitted to the decompression unit 90 in a transmission step 112. It is transmitted digitally, in particular. By way of example, the permutation matrix M, the signal $A_1$, the constants $B_2$, $C_2$, $B_3$, $C_3$ and the frequencies $n_1, n_2, n_3$ of the occurrence of the signals $A_1, A_2, A_3$ are transmitted during the transmission. With regard to the meaning of the constants $B_i$, $C_i$ reference should be made to the above description of the bundled coding of correlated signals (see FIG. 14).

Afterward, the data are decompressed in a decompression step 113. They are then depermutated with the aid of the inverse, $M^{-1}$, of the permutation matrix M in a depermutation step 114.

After the depermutation, the vector 109 with the signal constituents $A_1, A_2, A_3 \ldots A_n$ is present again in its original form. Here, too, it is once again possible to provide a lossy compression/decompression instead of a lossless compression/decompression.

The coding methods mentioned above can be improved even further if prior knowledge, in particular about environmental information, for example with the aid of further signals, in particular further measurement signals, is introduced for coding purposes. In particular, the data reduction can be improved further as a result. It is possible, in particular, to improve the data reduction by using models regarding the relationship between the measurement signals and the excitation of the mirror elements 23. Such models enable, in particular, a better prediction of the tilting angles and/or tilting angle errors.

Examples of prior knowledge and/or environmental information are, inter alia, the tilting angle setpoint values, the temperature, the temperature profile, the characteristics of the illumination radiation, in particular the activation of the radiation source 3, in particular the activation times and/or the activation frequency and/or the intensity of the emitted illumination radiation 10. Further environmental information which can advantageously be used is movements of the wafer holder and/or movements of the reticle holder, measurement data of dose sensors and measurement data of global acceleration sensors.

Even if the coding methods outlined above have been described in part in a manner detached from the other coding methods, a combination of the coding methods outlined is possible.

What is claimed is:

1. A device configured to control positioning of multiple displaceable mirror elements of a multi-mirror arrangement, the device comprising:
    a control facility separate from the multi-mirror arrangement, the control facility connected to the multi-mirror arrangement in a data-transmitting manner via a first data channel; and
    a supervisory unit connected to at least two inputs in a signal-transmitting manner, the first data channel being the single, common output of the supervisory unit,
    wherein the first data channel for each of the displaceable mirror elements has in each case a bandwidth of at least 1 kHz, and
    comprising a second data channel for signal transmission to the multi-mirror arrangement, the second data channel having a bandwidth of at most 500 Hz.

2. The device of claim 1, further comprising a digital-to-analog converter, wherein the first data channel is connected to a digital-to-analog converter in a signal-transmitting manner.

3. The device of claim 1, further comprising a sensor facility having a sampling frequency of at least 1 kHz for each controlled degree of freedom of displacement of the mirror elements.

4. The device of claim 1, wherein the first data channel has a bit depth of at most 32 bits.

5. The device of claim 1, wherein the device comprises a number of first data channels that is at least of the same magnitude as a number of displaceable mirror elements.

6. The device of claim 1, wherein, for a given mirror element, the bandwidth of the first data channel is at least double the bandwidth of the second data channel.

7. The device of claim 1, wherein, for a given mirror element, a bit depth of the first data channel is at most half a bit depth of the second data channel.

8. An optical component, comprising:
a multi-mirror arrangement comprising multiple mirror elements; and
a device according to claim 1.

9. The optical component of claim 8, further comprising analog circuits configured to actuate actuating the mirror elements, wherein the analog circuits are without feedback with respect to the position control.

10. An illumination optical unit, comprising:
an optical component, comprising:
a multi-mirror arrangement comprising multiple mirror elements; and
a device according to claim 1,
wherein the illumination optical unit is a lithography illumination optical unit.

11. An illumination system, comprising:
an illumination optical unit comprising an optical component which comprises:
a multi-mirror arrangement comprising multiple mirror elements; and
a device according to claim 1; and
a radiation source,
wherein the illumination optical unit is a lithography illumination optical unit.

12. An apparatus, comprising:
an illumination optical unit comprising an optical component which comprises:
a multi-mirror arrangement comprising multiple mirror elements; and
a device according to claim 1; and
a projection optical unit,
wherein the apparatus is a microlithography projection exposure apparatus.

13. A method of using a microlithography projection exposure apparatus comprising an illumination optical unit and a projection optical unit, the method comprising:
using the illumination optical unit to illuminate part of a reticle; and
using the projection optical unit to project at least part of the illuminated part of the reticle onto a light sensitive material,
wherein the illumination optical unit comprises an optical component which comprises:
a multi-mirror arrangement comprising multiple mirror elements; and
a device according to claim 1.

14. The method of claim 13, further comprising making a component.

15. The device of claim 1, wherein the second data channel has a bandwidth of at most 200 Hz.

16. A method of controlling positioning of multiple mirror elements of a multi-mirror arrangement, the multiple mirror elements being displaceable via actuators, the method comprising:
generating a data stream with signals from a control facility for activating the actuators via the control facility, the control facility being separate from the multi-mirror arrangement; and
transmitting the data stream via at least one first data channel to the multi-mirror arrangement,
wherein the at least one first data channel has a data rate which supports a bandwidth which is at least double a magnitude of a resonant frequency of one of the mirror elements, and each data channel has a maximum data flow of at most 40 kbit/s per mirror element.

17. The method of claim 16, further comprising using a sensor facility to detect: a) positioning the mirror elements; and/or b) changes of the mirror elements.

18. The method of claim 16, wherein the at least one data channel comprises a channel structure having at least two communication channels.

19. The method of claim 16, wherein the data stream generated by the control facility is coded.

20. The method of claim 16, wherein each data channel has a maximum data flow of at most 30 kbit/s per mirror element.

* * * * *

UNITED STATES PATENT AND TRADEMARK OFFICE
CERTIFICATE OF CORRECTION

PATENT NO. : 10,018,803 B2
APPLICATION NO. : 15/332187
DATED : July 10, 2018
INVENTOR(S) : Jan Horn et al.

Page 1 of 1

It is certified that error appears in the above-identified patent and that said Letters Patent is hereby corrected as shown below:

In the Specification

Column 5, Line 44, after "arrangement" insert --.--.

Column 26, Line 36, delete "a(x,y,n)" and insert --α(x,y,n)--.

Signed and Sealed this
Sixteenth Day of April, 2019

Andrei Iancu
*Director of the United States Patent and Trademark Office*